United States Patent
Izumi et al.

(10) Patent No.: US 6,562,659 B1
(45) Date of Patent: May 13, 2003

(54) EXTERNAL CIRCUIT PACKAGING METHOD AND THERMOCOMPRESSION BONDING APPARATUS

(75) Inventors: Yoshihiro Izumi, Kashihara (JP); Osamu Teranuma, Tenri (JP)

(73) Assignees: Sharp Kabushiki Kaisha, Osaka (JP); Shimadzu Corporation, Kyoto (JP)

(*) Notice: Subject to any disclaimer, the term of this patent is extended or adjusted under 35 U.S.C. 154(b) by 12 days.

(21) Appl. No.: 09/585,365

(22) Filed: Jun. 2, 2000

(30) Foreign Application Priority Data

Jun. 14, 1999 (JP) .......................................... 11-166825
Nov. 26, 1999 (JP) .......................................... 11-335729

(51) Int. Cl.[7] .............................................. H01L 22/44
(52) U.S. Cl. ...................................... 438/118; 438/106
(58) Field of Search ................................. 438/118, 106

(56) References Cited

U.S. PATENT DOCUMENTS 5,070,272 A * 12/1991 Kikawa et al. ............. 313/386
5,182,229 A * 1/1993 Arimoto ..................... 437/162
5,598,004 A * 1/1997 Powell et al. .......... 250/370.09

FOREIGN PATENT DOCUMENTS

| JP | 5-41091 U | * | 6/1993 |
| JP | 6-342098 A | | 12/1994 |
| JP | 342098/1994 | | 12/1994 |

OTHER PUBLICATIONS

Paper Abstracts, from the research group headed by Dr. John Rowlands of the UNiversity of Toronto [retrieved from the internet Jul. 9, 2002], <URL:http://www.sunnybrook.utoronto.ca:8080/~selenium/abstracts.html>.*

Uni–Cure System provided by Ushio Inc ( partial catalog including, p. 6).

U.S. patent application Ser. No. 09/477,338, Izumi et al., filed Jan. 4, 2000.

Lee et al, "A New Digital Detector for Projection Radiography", SPIE, vol. 2432, Jul. 1995, pp. 237–249.

Jeromin et al, "8.4: Application of a–Si Active–Matrix Technology in a X–Ray Detector Panel", SID 97 Digest, 1997, pp. 91–94.

* cited by examiner

*Primary Examiner*—Kamand Cuneo
*Assistant Examiner*—Scott B. Geyer
(74) *Attorney, Agent, or Firm*—Nixon & Vanderhye PC

(57) ABSTRACT

When TCP substrates serving as external circuits are packaged by thermocompression bonding onto input/output terminals on an active-matrix substrate including an a-Se film serving as an amorphous semiconductor layer, a cooling operation is performed by a cooling medium discharging nozzle on at least a part between the a-Se film and a thermocompression bonding part disposed between the TCP substrates and the input/output terminals on the active-matrix substrate. Thus, during the thermocompression bonding, a temperature of the a-Se film is maintained below its crystallizing temperature so as to prevent exfoliation of the amorphous semiconductor film and deterioration in characteristics thereof, upon packaging the external circuits by thermocompression bonding onto the input/output terminals on the substrate including the amorphous semiconductor film.

20 Claims, 13 Drawing Sheets

EXTERNAL CIRCUIT PACKAGING METHOD AND THERMOCOMPRESSION BONDING APPARATUS

FIELD OF THE INVENTION

The present invention relates to a method for packaging an external circuit of a substrate provided with an amorphous semiconductor layer, for example, a two-dimensional image detector for detecting an electromagnetic wave image including radiation such as an X-ray, a visible ray, and an infrared ray, and the present invention further concerns a thermocompression bonding apparatus used for the method.

BACKGROUND OF THE INVENTION

Conventionally, a two-dimensional image detector for radiation has been known, in which semiconductor sensors for generating electrical charge (electron-hole pair) by detecting an X-ray, namely, semiconductor sensors constituted by semiconductor layers, pixel electrodes and others with photoconductivity are two-dimensionally disposed (row and column directions), each pixel electrode is provided with a switching element, the switching elements are successively turned on for each row, and electrical charge of the sensors is read for each column.

A specific construction and principle of such a two-dimensional image detector are described in "D. L. Lee, et al., 'A New Digital Detector for Projection Radiography', SPIE, 2432, pp. 237–249, 1995", "L. S. Jeromin, et al., 'Application of a-Si Active-Matrix Technology in a X-ray Detector Panel', SID 97 DIGEST, pp. 91–94, 1997", and Japanese Laid-Open Patent Publication No. 342098/1994 (Tokukaihei 6-342098, published on Dec. 13, 1994).

The following explanation discusses the construction and principle of a conventional two-dimensional image detector for radiation.

FIG. 11 is a schematic diagram showing the construction of the conventional two-dimensional image detector for radiation. Further, FIG. 12 is a schematic diagram showing a sectional structure for one pixel of the two-dimensional image detector for radiation.

As shown in FIGS. 11 and 12, the two-dimensional image detector for radiation is provided with an active-matrix substrate 56. Electrode wires (a gate electrode group 64 composed of gate electrodes G1, G2, G3, . . . , Gn, and a source electrode group 65 composed of source electrodes S1, S2, S3, . . . , Sn) in an XY matrix form, a TFT (thin film transistor) 69, and a storage capacitor(Cs) 70, and others are formed on virtually the entire surface of the active-matrix substrate 56. Input/output terminals are formed on a surrounding part (not shown) of the active-matrix substrate 56. Further, a photoconductive film 52, a dielectric layer 68, and an upper electrode 66 are formed on virtually the entire surface of the active-matrix substrate 56.

The storage capacitor 70 has a construction in which a Cs electrode 74 is opposed via an insulating film 73 to a pixel electrode 72 connected to a drain electrode of the TFT 69.

As the photoconductive film 52 (amorphous semiconductor layer), a semiconducting material is used, which generates electrical charge (electron-hole pair) by exposure to radiation such as an X-ray. According to the aforementioned literatures, it is possible to adopt an organic substance such as a photoconductive polymer, which exerts photoconductivity by adding an X-ray absorbing compound, as well as amorphous-selenium (hereinafter, referred to as a-Se), lead monoxide, cadmium sulfide, and mercuric iodide. The photoconductive film 52 is formed with, for example, a thickness of 300 to 600 $\mu$m by using a vacuum evaporation method.

Further, an active-matrix substrate formed in a manufacturing process of a liquid crystal display device can be applicable as the active-matrix substrate 56. For example, the active-matrix substrate used for an active-matrix liquid crystal display device (AMLCD: Active Matrix LCD) is provided with a TFT made of a material such as amorphous silicon(a-Si) and polysilicon(p-Si), an XY matrix electrode, and a storage capacitor. Therefore, only a few changes in arrangement allows the active-matrix substrate to be adopted for the two-dimensional image detector for radiation.

The following explanation describes a principle of operations of the two-dimensional image detector for radiation having the above construction.

When radiation is emitted to the photoconductive film 52, electrical charge (electron-hole pair) is generated in the photoconductive film 52. As shown FIGS. 11 and 12, the photoconductive film 52 and the storage capacitors 70 are electrically connected in series. Thus, when voltage is applied between the upper electrode 66 and the Cs electrode 74 in the two-dimensional image detector for radiation, electrical charge (electron-hole pair) generated in the photoconductive film 52 moves to a positive electrode side and a negative electrode side. As a result, the storage capacitors 70 store electrical charge. Further, a carrier blocking layer 71 composed of a thin insulating layer is formed between the photoconductive film 52 and the storage capacitors 70. The carrier blocking layer 71 prevents electrical charge from being injected from only one of the photoconductive film 52 and the storage capacitors 70.

With the above-mentioned effect, the TFTs 69 come into an open state in response to input signals of gate electrodes G1, G2, G3, . . . , Gn, so that the electrical charge stored in the storage capacitors 70 can be applied from the source electrodes S1, S2, S3, . . . , Sn to the outside. The electrode group 64 including the gate electrodes G1, G2, G3, . . . , Gn, the source electrode group 65 including the source electrodes S1, S2, S3, . . . , Sn, the TFTs 69, and the storage capacitors 70 and others are formed in a XY matrix form. Therefore, it is possible to obtain two-dimensional image information of an X-ray by successively scanning signals inputted to gate electrodes G1, G2, G3, . . . , Gn, for each of the gate electrodes.

The above two-dimensional image detector is provided with a "driving circuit" (driving IC) for supplying driving voltage of a switching element (TFT) to the gate electrode group 64 and the source electrode group 65, and a "reading circuit" (reading IC) for reading image information, on the surrounding part of the active-matrix substrate 56. These circuits are packaged mainly in line with TCP (Tape Carrier Package) method and COG (Chip on Glass) method.

FIG. 13(a) shows an example of a conventional packaging according to TCP method. In TCP method, a wiring pattern made of aluminum foil is formed on a TCP substrate 59 including a base film made of a material such as polyimide, one end of an external circuit, on which electrical members such as a driving IC 60 and an IC 61 are mounted, is connected to a surrounding area of the active-matrix substrate 56 constituting the two-dimensional image detector for radiation, and the other end of the circuit is connected to an external circuit substrate (PWB: Printed Wiring Board) 62.

Further, FIG. 13(b) shows an example of a conventional packaging according to COG method. In COG method, the driving IC 60 and the reading IC 61 are mounted and connected as external circuits directly to the input/output terminals of the active-matrix substrate 56 constituting the two-dimensional image detector for radiation. Here, power supply and the input and output of signals are carried out by an FPC (Flexible Printed Circuit) substrate 67. One end of the FPC substrate 67 is connected to the input/output terminals (not shown) of the surrounding part on the active-matrix substrate 56 constituting the two-dimensional image detector, the end is electrically connected to the driving IC 60 and the reading IC 61 via the gate electrodes G1, G2, G3, . . . , Gn (gate electrode group 64) and the source electrodes S1, S2, S3, . . . , Sn (source electrode group 65) of the active-matrix substrate 56, and the other end of the FPC substrate 67 is connected to the external circuit substrate 62. As a variation of COG method, the driving IC 60 and the reading IC 61 can be formed in a monolithic manner upon manufacturing the active-matrix substrate 56.

Among the above packaging methods, as for connection between the TCP substrate 59 and the active-matrix substrate 56 (TCP connection), connection between the driving IC 60 or the reading IC 61 and the active-matrix substrate 56 (COG connection), connection between the FPC substrate 67 and the active-matrix substrate 56 (FPC connection), and in other cases, an anisotropic conductive adhesive is generally adopted and is subjected to a thermocompression bonding on bonding parts 58.

The anisotropic conductive adhesive is formed by evenly dispersing conductive particles into resin (binder) having adhesion. A paste type and a film type are available. As a special adhesive, a conductive material is formed into columns in a bonding film. As the binder used for the anisotropic conductive adhesive, a thermosetting resin and a thermoplastic resin are generally adopted. Table 1 shows the connecting conditions of representative anisotropic conductive adhesives.

However, conventionally, the above-mentioned problem has not been considered at all. Any solutions have not been provided, particularly for the problem occurring in a case where an a-Se film made of an amorphous semiconducting material is used for the photoconductive film 52 and heat is conducted to the photoconductive film 52. After due consideration by the applicant et al. of the present invention, it is understood that heat conducted to the a-Se film causes the following inconvenience.

Generally, the a-Se film formed by evaporation at 70–80° C. or less is amorphous and has high dark resistance of about $10^{12}$ Ωcm; thus, the a-Se film has proper characteristics for the two-dimensional image detector. However, when heat is applied at 70–80° C. or more after the film is formed, the dark resistance decreases to a minimum of about $10^5$ Ωcm. This is because the crystallization of the amorphous a-Se film is developed by heat.

Generally, in the two-dimensional image detector for radiation, the a-Se film is used as the photoconductive film 52. One of the reasons is that an image signal with excellent sensitivity to an X-ray (S/N ratio) can be obtained because of its high dark resistance. Therefore, dark resistance reduced by heat is a critical problem to the two-dimensional image detector for radiation.

Moreover, when crystallization of the a-Se film is developed by heating, due to a change in volume according to a phase change, the a-Se film is likely to be exfoliated from the active-matrix substrate 56, and other mechanical problems occur.

Here, when the used photoconductive film has photoconductivity to a visible ray and an infrared ray as well as radiation such as an X-ray, the two-dimensional image detector for radiation also acts as a two-dimensional image detector for a visible ray and an infrared ray. For instance, the a-Se film has favorable photoconductivity to a visible ray, and a high-sensitivity image sensor with the a-Se film

TABLE 1

| ANISOTROPIC CONDUCTIVE ADHESIVE | KIND OF BINDER | BONDING TEMPERATURE (° C.) | TIME (SECOND) |
|---|---|---|---|
| ANISOTROPIC CONDUCTIVE FILM Hitachi Chemical Co., Ltd. Anisolum AC-7073 | THERMOSETTING RESIN | 170 ± 10 | 20 |
| ANISOTROPIC CONDUCTIVE FILM SONY CHEMICALS CORP. CP87201H | THERMOSETTING RESIN | 220 ± 10 | 5≦ |

According to Table 1, in the case of the anisotropic conductive adhesive using the conventional thermosetting and thermoplastic resins, when adhesion and conduction are achieved by performing a thermosetting reaction or a thermoplastic operation on the above resins while pressurizing, a heating operation of (150° C. or more)×(5 to 30 seconds) is normally required.

Therefore, regarding the external circuits packaged in the conventional two-dimensional image detector for radiation, when the driving IC 60 and the reading IC 61 are packaged on a surrounding part of the active-matrix substrate 56 by using TCP method and COG method, heat is applied from the outside to exert the adhesion and conduction of the anisotropic conductive adhesive, and the heat is conducted via the active-matrix substrate 56 to the photoconductive film 52 formed on the active-matrix substrate 56, particularly to a part of the photoconductive film 52 in the vicinity of an image pick-up area.

has been developed by using an avalanche effect obtained by applying a high electric field. Thus, it is advantageous to avoid the aforementioned problems in developing kinds of substrates provided with the a-Se films.

In order to avoid such a problem, the following method can be adopted: the driving IC and the reading IC are packaged on the active-matrix substrate before the a-Se film is formed by TCP method and COG method, and the a-Se film is formed on the active-matrix substrate at room temperature.

However, it is necessary to provide a step of installing the active-matrix substrate, on which the driving IC and the reading IC are packaged, into a vacuum chamber, and depositing the a-Se film. Thus, during the step, the driving IC and the reading IC are more likely to be damaged. Further, when the a-Se film is formed by an automatic mass-producing apparatus, a special system for transporting the substrate is necessary to prevent damage on the driving IC and the reading IC.

Further, in this method, the a-Se film is not formed on the active-matrix substrate in the step of packaging the driving IC and the reading IC; thus, a surface of the active-matrix substrate is likely to be contaminated by an organic substance and moisture. Therefore, when a surface of the active-matrix substrate is contaminated, an adhesion defect may occur on the a-Se film formed after the packaging step.

Furthermore, when a defect is found on the driving IC and the reading IC, a re-packaging step (rework) is necessary for replacing the TCP, the COG, and others. However, when a defect is found after the a-Se film is formed, heat applied during the rework packaging is conducted to the a-Se film. Consequently, the above-mentioned method for forming the a-Se film at room temperature after packaging cannot carry out the rework packaging without causing degradation in characteristics of the a-Se film.

SUMMARY OF THE INVENTION

The objective of the present invention is to provide an external circuit packaging method, which does not cause exfoliation of an amorphous semiconductor layer and degradation in characteristics thereof in a case where external circuits are disposed on input/output terminals of a substrate including the amorphous semiconductor layer, and to provide a thermocompression bonding apparatus used for the method.

In order to achieve the above objective, the external circuit packaging method of the present invention, in which the external circuits are packaged by thermocompression bonding onto the input/output terminals of the substrate including the amorphous semiconductor layer, is characterized in that the amorphous semiconductor layer maintains a temperature below a crystallizing temperature thereof during the thermocompression bonding.

According to this method, even when the external circuits are packaged onto the input/output terminals of the substrate by a conventional thermocompression bonding method such as TCP method and COG method, it is possible to prevent crystallization from deteriorating characteristics such as high dark resistance of the amorphous semiconductor layer. This method therefore makes it possible to prevent exfoliation resulted from a change in volume according to a phase change of the amorphous semiconductor layer and to prevent deterioration in characteristics such as high dark resistance of the amorphous semiconductor layer. Further, with this method, the external circuits are packaged onto the substrate including the amorphous semiconductor layer, so that it is possible to prevent a variety of problems caused by forming the amorphous semiconductor layer after packaging the external circuits, and in the event of a defect on the external circuits such as a driving IC and a reading IC, it is possible to prevent exfoliation of the amorphous semiconductor layer and deterioration in characteristics thereof during a re-packaging operation. Consequently, according to this method, regardless of whether a packaging or a re-packaging, it is possible to provide an external circuit packaging method which does not cause exfoliation of the amorphous semiconductor layer and deterioration in characteristics thereof, upon packaging the external circuits by thermocompression bonding onto the input/output terminals of the substrate including the amorphous semiconductor layer.

The external circuit packaging method of the present invention performs a cooling operation on, for example, at least a) a part between the amorphous semiconductor layer and a thermocompression bonding part disposed between the external circuits and the input/output terminals on the substrate and/or b) a part of the amorphous semiconductor layer in the vicinity of the input/output terminals, in order to maintain a temperature of the amorphous semiconductor layer below a crystallizing temperature thereof during a thermocompression bonding.

With this method, a cooling operation is performed on at least the part between the amorphous semiconductor layer and the thermocompression bonding part disposed between the external circuits and the input/output terminals on the substrate, so that the cooling operation is performed from the thermocompression bonding part to the amorphous semiconductor layer. Therefore, most of heat can be removed before the heat is conducted from the thermocompression bonding part to the amorphous semiconductor layer. Hence, in this case, it is possible to further efficiently suppress heat conduction from the thermocompression bonding part to the amorphous semiconductor layer. Consequently, it is possible to efficiently suppress an increase in temperature of the amorphous semiconductor layer so as to maintain a temperature thereof below a crystallizing temperature thereof during the thermocompression bonding.

Moreover, a cooling operation is performed on at least the part of the amorphous semiconductor layer in the vicinity of the input/output terminals so as to cool a starting point of heat conduction on the amorphous semiconductor layer, the heat being conducted from the thermocompression bonding part. Thus, it is possible to suppress an increase in temperature of the amorphous semiconductor layer, that is caused by heat conducted from the thermocompression bonding part. In the part of the amorphous semiconductor layer in the vicinity of the input/output terminals, the cooling operation is particularly effective in the case of a short distance between the input/output terminals and the amorphous semiconductor layer on the substrate. A cooling operation is performed on the part of the amorphous semiconductor layer in the vicinity of the input/output terminals, so that it is possible to suppress the cooling effect on the thermocompression bonding part so as to efficiently perform a thermocompression bonding, and to suppress an increase in temperature of the amorphous semiconductor layer so as to maintain a temperature thereof below a crystallizing temperature thereof, even in the case of a short distance between the amorphous semiconductor layer and the input/output terminals on the substrate.

Therefore, according to this method, it is possible to provide an external circuit packaging method which does not cause exfoliation of the amorphous semiconductor layer and the deterioration in characteristics thereof upon packaging the external circuits onto the input/output terminals on the substrate including the amorphous semiconductor layer.

Further, the external circuit packaging method of the present invention can be also arranged such that a cooling and/or heat-dissipating operation is performed on an area of a substrate placement part, that corresponds to at least a) the part between the amorphous semiconductor layer and the thermocompression bonding part disposed between the external circuits and the input/output terminals on the substrate and/or b) the part of the amorphous semiconductor layer in the vicinity of the input/output terminals, in order to maintain a temperature of the amorphous semiconductor layer below a crystallizing temperature thereof during a thermocompression bonding, the substrate placement part being provided with the substrate thereon during the thermocompression bonding.

In this case, the substrate subjected to a thermocompression bonding is placed on the substrate placement part such that a surface of the substrate and a surface of the substrate placement part are in parallel with each other. Only this arrangement makes it possible to suppress an increase in temperature of the amorphous semiconductor layer by cooling and/or dissipating heat on the substrate placement part, so that a temperature of the amorphous semiconductor layer can be simply and efficiently maintained below a crystallizing temperature thereof.

In order to achieve the aforementioned objective, a thermocompression bonding apparatus of the present invention, in which a thermocompression bonding member is provided and the external circuits are packaged by thermocompression bonding onto the input/output terminals on the substrate including the amorphous semiconductor layer, is characterized by including a cooling/heat-dissipating mechanism for cooling and/or dissipating heat on at least a) the part between the amorphous semiconductor layer and the thermocompression bonding part disposed between the external circuits and the input/output terminals and/or b) the part of the amorphous semiconductor layer in the vicinity of the input/output terminals, during a thermocompression bonding.

According to this arrangement, the cooling/heat-dissipating mechanism cools and/or dissipates heat on the part between the amorphous semiconductor layer and the thermocompression bonding part disposed between the input/output terminals and the external circuits, or the part of the amorphous semiconductor layer in the vicinity of the input/output terminals during the thermocompression bonding; thus, it is possible to suppress an increase in temperature of the amorphous semiconductor layer, that is caused by heat conducted from the thermocompression bonding part. Hence, during the thermocompression bonding, a temperature of the amorphous semiconductor layer can be maintained below a crystallizing temperature thereof. Consequently, this arrangement makes it possible to provide the thermocompression bonding apparatus, in which the external circuits are packaged by thermocompression bonding without causing exfoliation of the amorphous semiconductor layer and deterioration in characteristics thereof, upon packaging the external circuits by thermocompression bonding onto the input/output terminals on the substrate including the amorphous semiconductor layer, namely, it is possible to provide the thermocompression bonding apparatus used for the external circuit packaging method of the present invention.

In order to solve the aforementioned problem, the thermocompression bonding apparatus of the present invention is further provided with the substrate placement part for placing the substrate thereon. The cooling/heat-dissipating mechanism can be also arranged such that a cooling and/or heat-dissipating operation is performed on the substrate placement part so as to cool and/or dissipate heat on a) the part between the amorphous semiconductor layer and the thermocompression bonding part disposed between the input/output terminals and the external circuits and/or b) the part of the amorphous semiconductor layer in the vicinity of the input/output terminals.

According to this arrangement, the substrate subjected to a thermocompression bonding is disposed such that the surface of the substrate and the surface of the substrate placement part are in parallel with each other. Only this arrangement makes it possible to suppress an increase in temperature of the amorphous semiconductor layer formed on the substrate, by cooling and dissipating heat on the substrate placement part. Hence, it is possible to simply and efficiently maintain a temperature of the amorphous semiconductor layer below a crystallizing temperature thereof.

For a fuller understanding of the nature and advantages of the invention, reference should be made to the ensuing detailed description taken in conjunction with the accompanying drawings.

BRIEF DESCRIPTION OF THE DRAWINGS

FIG. 5($b$) is a sectional drawing showing a positional relationship between a heating head and a cooling medium discharging nozzle, that are used for the external circuit packaging method shown in FIG. 5($a$), taken in a direction of arrow A of FIG. 5($a$).

FIG. 13(b) is a sectional drawing showing an example of packaging external circuits on the conventional two-dimensional image detector in accordance with conventional COG method.

DESCRIPTION OF THE EMBODIMENTS

EMBODIMENT 1

Referring to figures, the following explanation describes the detail of one embodiment in accordance with the present invention.

Figure 1:
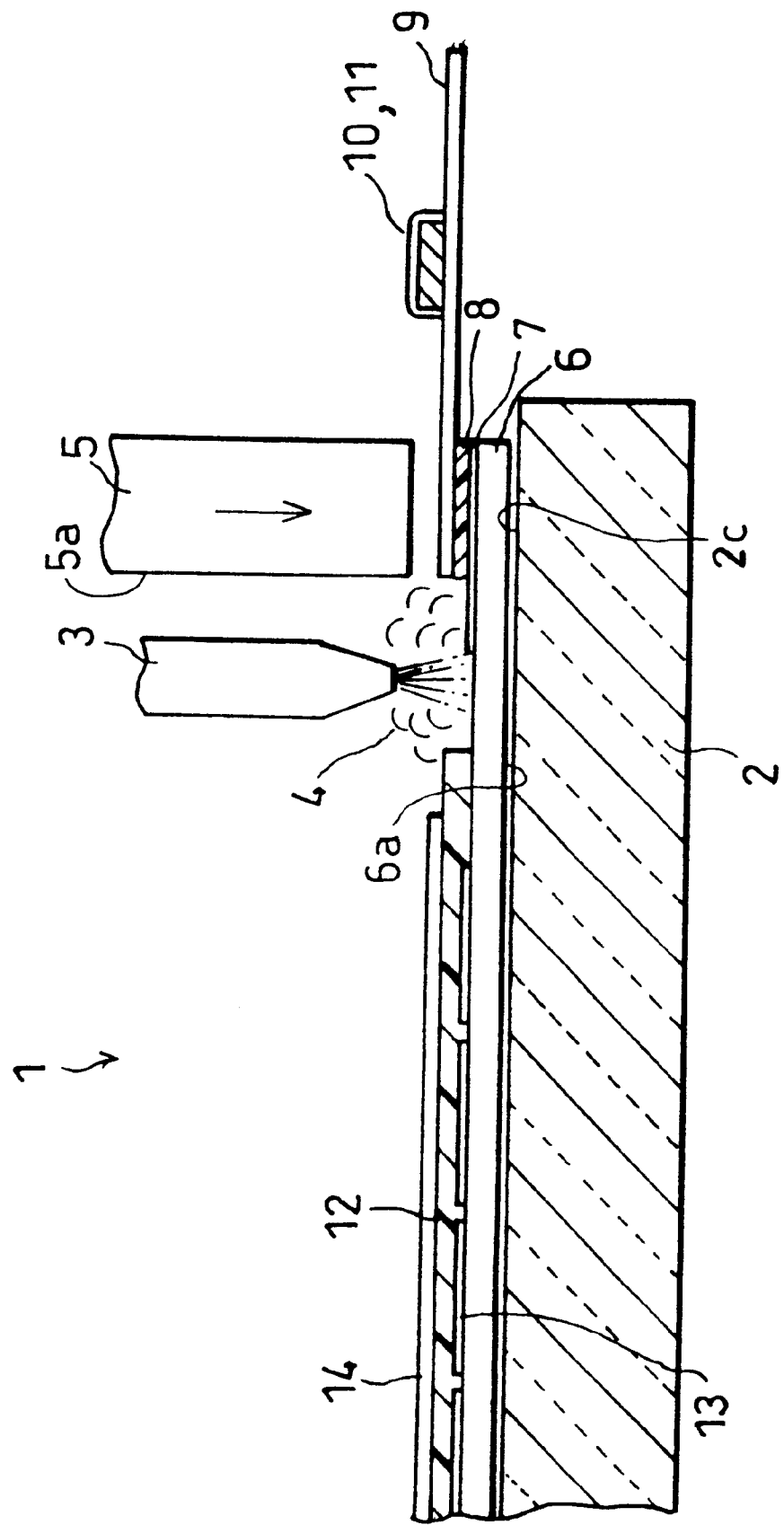
FIG. 1 is an explanatory drawing showing an external circuit packaging method for a two-dimensional image detector in accordance with one embodiment of the present invention.
Figure 2:
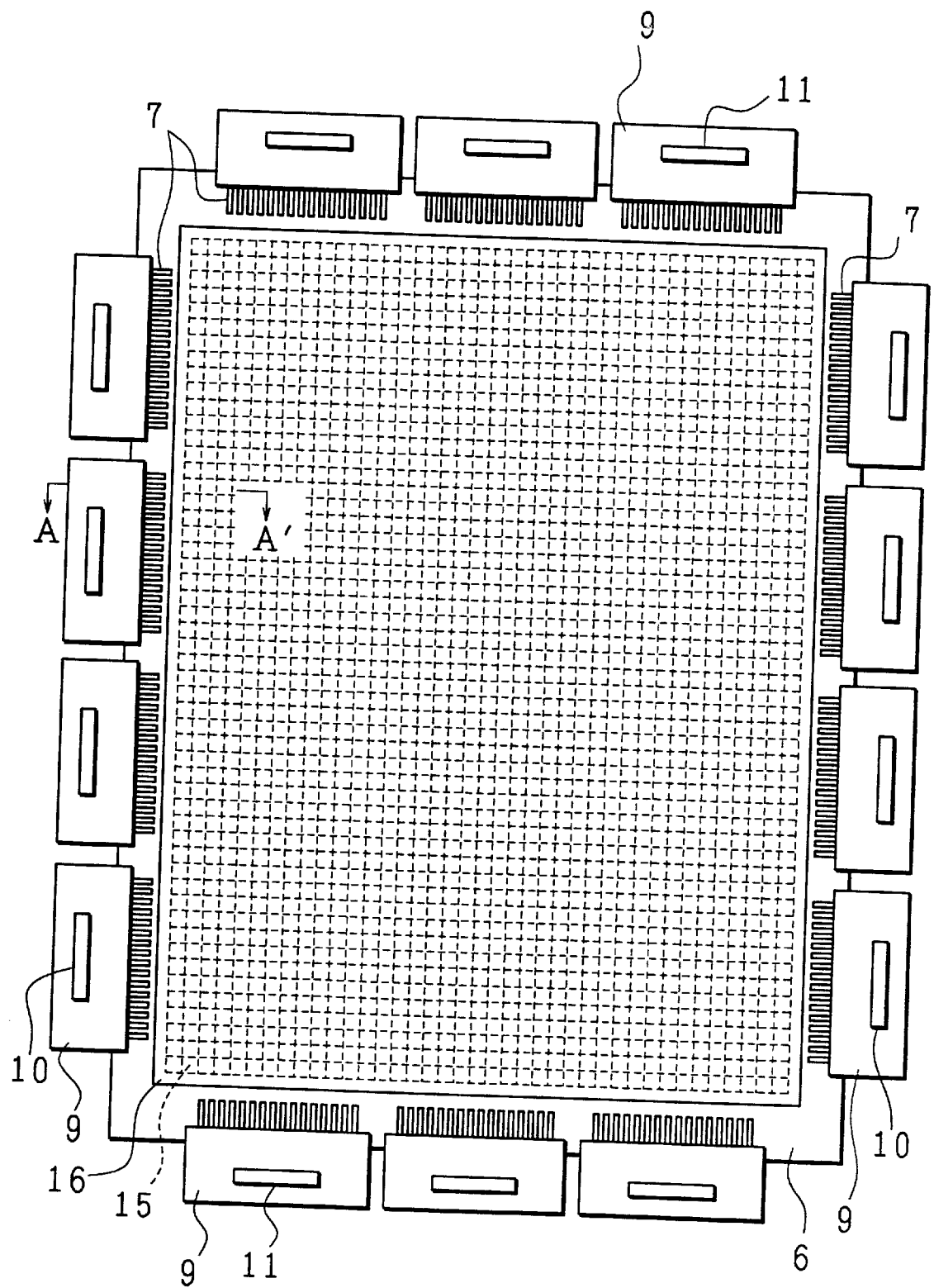
FIG. 2 is a plan view showing an example of the entire construction of a two-dimensional image detector using the external circuit packaging method for the two-dimensional image detector in accordance with one embodiment of the present invention.

FIG. 1 is an explanatory drawing showing a method for packaging an external circuit (hereinafter, simply referred to as "external circuit packaging method") for a two-dimensional image detector (substrate) in accordance with the present embodiment. FIG. 2 is a plan view showing an example of the two-dimensional image detector using the external circuit packaging method in accordance with the present embodiment. FIG. 1 is a sectional view taken along line A–A' shown in FIG. 2.

FIG. 1 shows a construction in which a thermocompression bonding apparatus 1 is used for connecting (packaging) a two-dimensional image detector of FIG. 2 and external circuits such as a driving IC 10 and a reading IC 11 or external circuits (not shown) by using the TCP method.

As shown in FIGS. 1 and 2, the two-dimensional image dectector of the present emdiment is provided with electrode wires (not shown) including gate electrodes and source electrodes formed in an XY matrix form, switching elements (not shown) such as TFTs provided respectively for pixels, storage capacitors (not shown), a pixel alignment layer 15 on which pixel electrodes 13 and others are formed, on an active-matrix substrate 6 serving as an electrode substrate. On the pixel alignment layer 15, an a-Se film 12, which serves as an amorphous semiconducting layer with electromagnetic wave conduction, and a common electrode 14 (upper electrode) are stacked in this order so as to cover the pixel alignment layer 15. FIG. 2 shows the relationship between the pixel alignment layer 15 and a placement area 16 of the a-Se film 12.

Additionally, the active-matrix substrate 6 can be formed in the same process as that of a liquid crystal display apparatus. Namely, the active-matrix substrate used for an active-matrix liquid crystal display apparatus (AMLCD: Active Matrix LCD) is provided with TFTs made of a material such as amorphous silicon (a-Si) and polysilicon (p-Si), XY matrix electrodes, and storage capacitors. Thus, only a few changes in the arrangement allows the active-matrix substrate to be used for the two-dimensional image detector.

Here, as described in the technical literatures of the conventional art, the fundamental construction and the manufacturing method of the active-matrix substrate have been already known and are the same as those of an active-matrix substrate 56 shown in FIGS. 11 to 13(a) and 13(b). Thus, the detailed description thereof is omitted.

In the present invention, the electromagnetic wave conduction refers to a characteristic generating electrical charge (electron-hole pair) in response to radiation of an electromagnetic wave such as an X-ray, an ultraviolet ray, an infrared ray, and a visible ray.

Here, the a-Se film 12 is an amorphous semiconductor layer mainly composed of selenium, namely, containing selenium with a ratio of 50 percents or more by weight. Additionally, as described above, the a-Se film 12 develops its crystallization so as to change its property at 70° C. (crystallizing temperature of the a-Se film) or more.

The a-Se film 12 and the common electrode 14 are both formed by using a vacuum evaporation method at room temperature. For example, the a-Se film 12 is formed with a thickness of about 500 $\mu$m so as to sufficiently absorb an X-ray. Here, in some cases, a buffer layer is disposed on an upper or lower surface of the a-Se film 12 in order to prevent a carrier from being injected from an electrode and in order to prevent crystallization of the a-Se film 12. Further, a metal film made of a material such as Au and Pt is formed with a thickness of 0.1 to 0.3 $\mu$m on the common electrode 14.

As for the amorphous semiconductor layer having electromagnetic wave conduction used for the external circuit packaging method of the present invention, in addition to the a-Se film 12, it is possible to adopt a semiconductor material, which generates electrical charge (electron-hole pair) by receiving (emitting) an electromagnetic wave image of an X-ray, an ultraviolet ray, an infrared ray, and a visible ray. As the amorphous semiconductor layer, an a-Si film, an a-SiC film, and an a-SiGe film are available in addition to the a-Se film 12.

An image detecting section of the two-dimensional image detector used in the present embodiment is disposed on an area formed by a pixel alignment layer 15, the a-Se film 12, and the common electrodes 14, namely, on a placement area of the pixel alignment layer 15 which is covered with the placement area 16 of the a-Se film 12 in FIG. 2. The image detecting section detects an electromagnetic wave image, which is emitted to the amorphous semiconductor layer, as electrical charge and outputs an image signal corresponding to the electromagnetic wave image.

Moreover, as shown in FIG. 2, on ends (surrounding part) of the active-matrix substrate 6, a plurality of input/output terminals 7 are disposed as connecting terminals for connecting the external electrical circuits (external circuit). Upon inputting and outputting an electric signal to the gate electrodes and source electrodes disposed in an image pick-up area, the input/output terminals 7 input a control signal for detecting an electromagnetic wave image, which is emitted to the amorphous semiconductor layer (a-Se film 12), and the input/output terminals 7 output an image signal corresponding to the electromagnetic wave image. Namely, the input/output terminals 7 are provided for inputting a control signal to the gate electrodes from the external electrical circuits (external circuit), and the control signal turns on the TFTs so as to take out electrical charge, which is accumulated in the storage capacitors, from the source electrodes to the outside as an image signal. Further, when outputting the image signal taken out to the outside, the input/output terminals 7 are used in the same manner.

FIGS. 1 and 2 show a construction in which the driving ICs 10 and reading ICs 11 serving as external circuits are connected (packaged) by the TCP method via TCP substrates 9 to the input/output terminals 7 formed on the active-matrix substrate 6.

In FIGS. 1 and 2, the construction of the TCP substrate 9 is identical to that of a TCP substrate 59 shown in FIG. 13(a), in which a wiring pattern is formed by a copper foil and the like, and the driving IC and the reading IC are mounted (packaged) on the substrate provided with a base film made of a material such as polyimide. One end of the TCP substrate 9 is connected to the input/output terminals 7 disposed on the surrounding part of the active-matrix substrate 6, which constitutes the two-dimensional image detector, and the other end is connected to the external circuit substrate (PWB) (external circuit, not shown). Here, in FIG. 2, for convenience of understanding, the number of the connected TCP substrates 9 is smaller than that of the actual arrangement.

In the above external circuit mounting method, an anisotropic conductive adhesive is used for packaging (TCP connecting) the TCP substrates 9 onto the active-matrix substrate 6, and the anisotropic conductive adhesive undergoes a thermocompression bonding at thermocompression bonding parts 8 of the input/output terminals 7. The anisotropic conductive adhesive connects the TCP substrates 9 and the active-matrix substrate 6 at the thermocompression bonding parts 8 on the input/output terminals 7 by using its adhesion, and the anisotropic conductive adhesive electrically connects the input/output terminals 7 to the outside by using its anisotropic conduction. A film-type anisotropic conductive adhesive (ACF: Anisotropic Conductive Film), that has been conventionally adopted, is used in the present embodiment. The adhesive is made of a thermosetting resin.

The following explanation describes the external circuit packaging method of the present embodiment in the order of steps.

(1) Firstly, the ACF is bonded to the input/output terminals 7 disposed on the surrounding part 6 of the active-matrix substrate 6. And then, one end of the TCP substrate 9 (film) is aligned to the ACF and disposed thereon, namely, the connecting parts are determined and temporarily bonded.

(2) Afterwards, in a final thermocompression bonding step for the TCP substrates 9, a thermocompression bonding is performed by the thermocompression bonding apparatus 1 of FIG. 1.

The thermocompression bonding apparatus 1 used in the present embodiment is provided with a stage 2 (substrate placing section) for mounting the two-dimensional image detector (substrate); a heating head 5 (thermocompression bonding means; thermocompression bonding member) which serves as a heating tool for heating and pressurizing the anisotropic conductive adhesive via the TCP substrates 9 serving as the external circuits, the adhesive being disposed on the thermocompression bonding parts 8 between the two-dimensional image detector and the TCP substrates 9 serving as the external circuits; and a cooling medium discharging nozzle 3 (discharging nozzle, cooling/heat-dissipating mechanism, and a cooling medium supplying means) for cooling a desired place of the two-dimensional image detector. Further, the cooling medium discharging nozzle 3 has a construction for discharging a cooling medium 4 from the top of the nozzle.

The thermocompression bonding apparatus 1 has a construction in which the cooling medium discharging nozzle 3 is disposed between the heating head 5 and the a-Se film 12 in parallel with the heating head 5. The cooling medium 4 is discharged from the cooling medium discharging nozzle 3 along the length of the heating head 5 and in parallel with the normal to the stage 2. Namely, the top of the cooling medium discharging nozzle 3 is directed to a gap between the a-Se film 12 and a side 5a of the heating head 5, that faces the a-Se film 12, in other words, between the input/output terminals 7 and the a-Se film 12 of the active-matrix substrate 6.

The following explanation discusses the detail of the thermocompression bonding step of (2).

Firstly, as shown in FIG. 1, the two-dimensional image detector, in which the a-Se film 12 serving as an amorphous semiconductor layer is formed on the active-matrix substrate 6, is disposed on the stage 2 of the thermocompression bonding apparatus 1 with the input/output terminals 7 being placed on the active-matrix substrate 6. With this arrangement, the active-matrix substrate 6 is disposed on the stage 2 such that a surface 6a of the active-matrix substrate 6, on which the members such as the a-Se film 12 are not disposed, is in contact with an upper surface 2c of the stage 2. It is possible to previously carry out a temporary press-bonding of the TCP substrate 9 to the active-matrix substrate 6, or the temporary bonding can be included in a series of steps for the aforementioned thermocompression bonding.

Next, a cooling operation is started by discharging nitrogen gas, which is cooled to 5° C. (cooling medium 4), from the cooling medium discharging nozzle 3 to a gap between the a-Se film 12 and the input/output terminals 7 provided on the surrounding part of the active-matrix substrate 6, on which the TCP substrate 9 is temporarily pressed and bonded.

In this state, the heating head 5 is moved downward by an air cylinder (not shown) in a perpendicular direction (direction of an arrow shown on the heating head 5 of FIG. 1), and a pressure of 10 to 30 kgf/cm$^2$ is applied to the ACF via the TCP substrate 9. At the same time, the heating head 5 is used for heating the ACF via the TCP substrate 9 under the condition of approximately 170° C.×20 seconds. In this way, the heating head 5 presses and heats the ACF so as to package the ACF by heat-curing and bonding. Here, after the packaging, the heating head 5 is moved upward in a perpendicular direction by using the air cylinder.

Additionally, nitrogen gas cooled to 5° C. is used in the present embodiment; however, the cooling conditions such as a cooling temperature, a cooling time, and an amount of the supplied cooling medium 4 are not particularly limited as long as a temperature is not increased to a temperature (crystallizing temperature) where the amorphous semiconductor layer (the a-Se film 12 in the present embodiment) starts its crystallization. Namely, the cooling conditions such as a cooling temperature, a cooling time, and an amount of the supplied cooling medium 4 are determined in accordance with a kind of the used amorphous semiconductor layer, size, a distance between the thermocompression bonding part 8 and the amorphous semiconductor layer, a cooling position, and others, such that heat conduction from the heating head 5 to the amorphous semiconductor layer can be effectively interrupted and a temperature of the amorphous semiconductor layer is maintained below its crystallizing temperature.

When the amorphous semiconductor layer such as the a-Se film 12 contains selenium as a main component, the a-Se film 12 starts its crystallization at the crystallizing temperature of 70° C. or more. Therefore, when a temperature is not increased to the crystallizing temperature of the a-Se film 12, a temperature of the a-Se film 12 is kept below 70° C. in the thermocompression bonding.

As described above, in the present embodiment, while the gap between the a-Se film 12 and the input/output terminals 7 on the active-matrix substrate 6 is cooled by nitrogen gas (5° C.) discharged from the cooling medium discharging nozzle 3, the connection is made between the TCP substrates 9 and the input/output terminals 7 by performing a thermocompression bonding on the ACF by using the heating head 5, namely, the external circuits are packaged.

With this arrangement, the cooling operation is carried out from the input/output terminals 7 to the a-Se film 12, so that most of heat can be removed before the heat is conducted to the a-Se film 12. Hence, upon curing the ACF, unlike the conventional external circuit packaging method, when heat is applied from the heating head 5 to the ACF and is conducted to the amorphous semiconductor layer, a temperature of the a-Se film 12 is not increased to the crystallizing temperature or more.

The TCP substrate 9 is heat bonded to the input/output terminals 7 on the surrounding part of the active-matrix substrate 6 in accordance with the above-mentioned external circuit packaging method and a temperature is measured at an end of the a-Se film 12, that is nearest to the input/output terminals 7. In this case, it is confirmed that a temperature of the a-Se film 12 rises to no more than about 30 to 40° C. at the position (the end). Consequently, it is understood that the above method makes it possible to maintain a temperature of the a-Se film 12 below its crystallizing temperature during the thermocompression bonding.

Meanwhile, when a cooling operation using nitrogen gas of 5° C. is not carried out upon packaging, a temperature of the end rises to about 90° C.

As mentioned above, the external circuit packaging method of the present embodiment, in which the external circuits are packaged by thermocompression bonding to the input/output terminals of the substrate provided with the amorphous semiconductor layer, includes the step of maintaining a temperature of the amorphous semiconductor layer below its crystallizing temperature by cooling at least a gap between the amorphous semiconductor layer and the thermocompression bonding part disposed between the external circuits and the input/output terminals on the substrate.

According to this method, at least a part of a path for conducting the heat is cooled so as to interrupt the heat conduction from the thermocompression bonding part to the amorphous semiconductor layer, thereby more efficiently suppressing an increase in temperature of the amorphous semiconductor layer.

Here, the heat conducting path includes a path for conducting heat through air to the amorphous semiconductor layer, the heat being dissipated from the thermocompression bonding means.

According to this method, the cooling operation is carried out from the thermocompression bonding part to the amorphous semiconductor layer, so that most of heat can be removed before the heat is conducted from the thermocompression bonding part to the amorphous semiconductor layer. Thus, it is possible to more efficiently suppress the heat conduction from the thermocompression bonding part to the amorphous semiconductor layer. As a result, a temperature increase of the amorphous semiconductor layer can be suppressed so as to maintain a temperature of the amorphous semiconductor layer below its crystallizing temperature during the thermocompression bonding.

Therefore, as described above, the external circuit packaging method of the present embodiment is used for, for example, performing a thermocompression bonding on the TCP substrates 9 and the input/output terminals 7 disposed on the surrounding part of the active-matrix substrate 6; thus, the TCP-method external circuits of FIG. 2 can be efficiently packaged without causing degradation in characteristics (for example, dark resistance), and it is possible to prevent exfoliation of the film, that results from a change in volume according to a phase change of the a-Se film 12. The phase change is caused by packaging the TCP substrate 9.

Further, according to this method, it is not necessary to deposit the a-Se film 12 and others after packaging the TCP substrate 9 to prevent degradation in characteristics, that is caused by the heating operation. Thus, when the substrate, on which the driving ICs 10 and the reading ICs 11 are packaged, is installed into the vacuum chamber before depositing the a-Se film 12, a special system for transporting the substrate is not necessary for preventing damage on the driving ICs 10 and the reading ICs 11. Furthermore, the amorphous semiconductor layer can be formed on the active-matrix substrate 6 so as to minimize the contamination of the active-matrix substrate before forming the amorphous semiconductor layer. For this reason, it is possible to effectively and economically manufacture the two-dimensional image detector.

Additionally, in a method for forming] the a-Se film 12 after packaging, when a defect is found on the external circuit after the a-Se film 12 is formed, a re-packaging operation (rework) is carried out for replacing the defective external circuit (for example, the TCP substrate 9, the COG, and others), resulting in the inconvenience of degradation in characteristics of the a-Se film 12 because of the heating operation.

However, according to the external circuit packaging method of the present embodiment, unlike the above-described arrangement the a-Se film 12 is not heated when connecting the TCP substrates 9, namely, the step of packaging the external circuits; consequently, the characteristics of the a-Se film 12 are not degraded. Therefore, the rework can be carried out with ease.

Here, the present embodiment discusses the external circuit packaging method for the two-dimensional image detector as the external circuit packaging method for the substrate provided with the amorphous semiconductor layer. However, the external circuit packaging method of the present embodiment can be generally adopted for the step of packaging the external circuits by performing a thermocompression bonding onto the input/output terminals of the substrate, which is provided with the amorphous semiconductor layer around the input/output terminals. Thus, the method is not particularly limited to the packaging of the two-dimensional image detector.

Moreover, the present embodiment describes the construction in which the packaging is carried out after the cooling operation is started by discharging nitrogen gas from the cooling medium discharging nozzle 3. However, the order of the cooling and the packaging can be arranged arbitrarily in accordance with a length of the gap, a crystallizing time of the amorphous semiconductor layer, a heating temperature of the heating head 5, and other conditions. As long as a temperature of the amorphous semiconductor layer is maintained below its crystallizing temperature during the thermocompression bonding, the order of the cooling and the packaging is not particularly limited.

Therefore, for instance, the packaging and the cooling can be simultaneously started, or the cooling can be started after the start of the packaging. In order to more effectively interrupt the heat conduction from the heating head 5 to the amorphous semiconductor layer, it is more preferable to start the packaging after the cooling is started. This is because a temperature of a desired area can be sufficiently lowered and a temperature increase can be suppressed with ease by starting the cooling before heating during the packaging.

Furthermore, it is more preferable to perform the cooling in the temporary pressing and bonding process as well as the above-mentioned final pressing bonding process. Also, in the present embodiment, the ACF is adopted as the anisotropic conductive adhesive used for the pressing and bonding, namely, the thermocompression bonding of the present invention; however, the anisotropic conductive adhesive is not particularly limited to the ACF. For example, it is possible to adopt a paste-type or film-type resin (binder) with adhesion that is formed by evenly dispersing conductive particles therein. Moreover, a special film is also available, in which a conductive material is formed into columns in a bonding film. A thermosetting resin and a thermoplastic resin are generally adopted as the binder used for the anisotropic conductive adhesive. For example, the anisotropic conductive adhesive of Table 1 can be used for packaging the external circuits of the present invention.

Furthermore, in the present embodiment, nitrogen gas is used as the cooling medium 4 discharged from the cooling medium discharging nozzle 3. However, the cooling medium 4 is not particularly limited. Other heating mediums are also applicable if they are capable of cooling. For example, as the cooling medium 4, it is possible to adopt a CFC substitute agent, compressed air, various kinds of cooling gases, liquid with high volatility, a cooling solid, and others.

Among the above cooling agents, nitrogen and the CFC substitute agent are particularly preferable because they are readily supplied as cooling liquid from the discharging nozzle.

Moreover, in the present embodiment, the active-matrix substrate 6 is cooled from the upper surface thereof. For example, it is also possible to directly cool the active-matrix substrate 6 from the back thereof by making a partial opening corresponding to the cooled part (namely, the gap between the thermocompression bonding part 8 and the a-Se film 12) on the stage 2.

Figure 3:
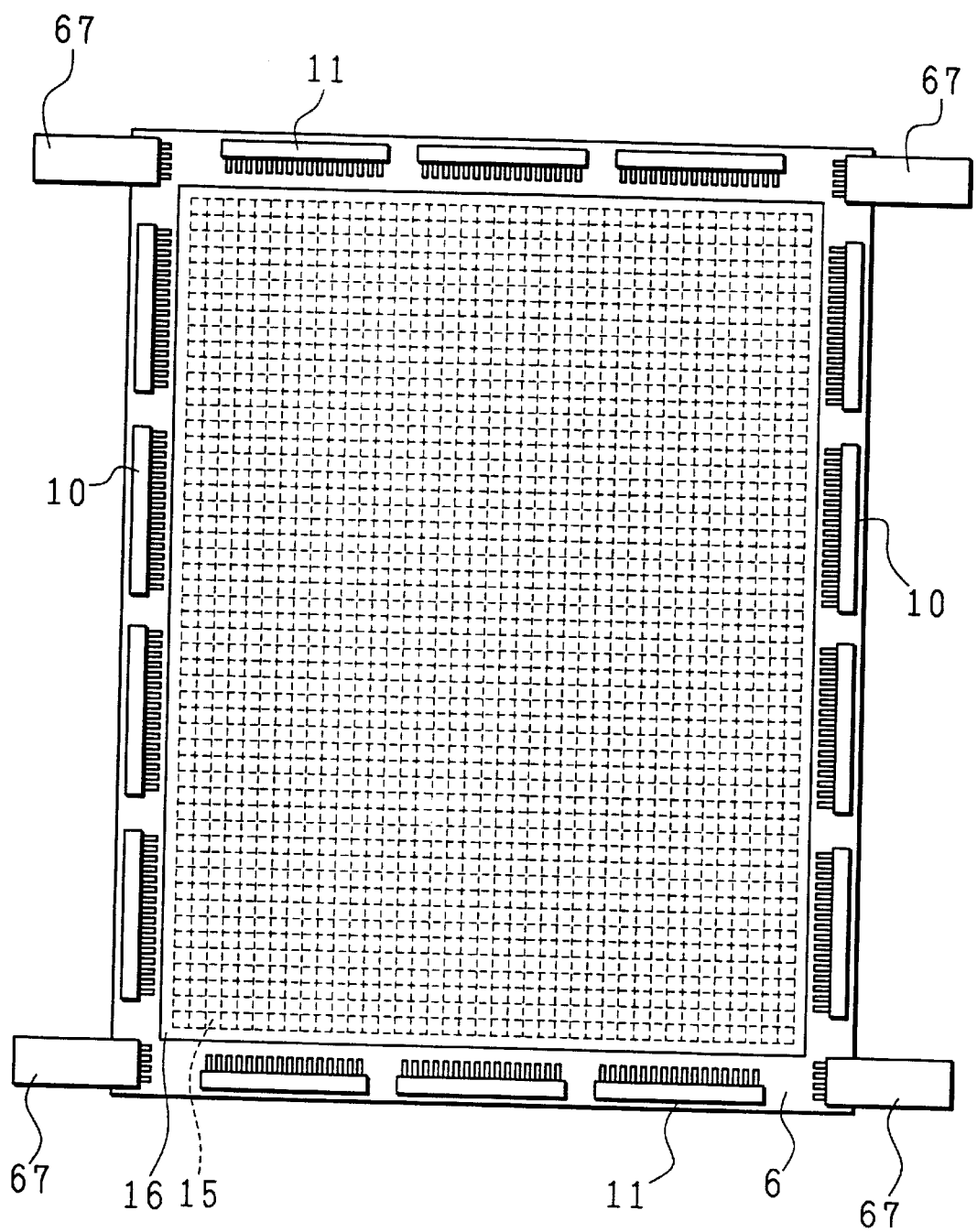
FIG. 3 is a plan view showing another example of the entire construction of the two-dimensional image detector using the external circuit packaging method for the two-dimensional image detector in accordance with one embodiment of the present invention.

Additionally, in the present embodiment, the TCP substrates 9 (film) are packaged (TCP connection) onto the input/output terminals 7 provided on the surrounding part of the active-matrix substrate 6 in the two-dimensional image detector. As shown in FIG. 3, the external circuit packaging method of the present embodiment is also applicable to the COG connection, in which the driving ICs 10 and the reading ICs 11 are directly connected to the active-matrix substrate 6, and the FPC connection, in which the FPC substrate and the active-matrix substrate 6 are connected to each other.

EMBODIMENT 2

In Embodiment 1, an external circuit packaging method, in which external circuits are packaged by thermocompression bonding onto input/output terminals of a substrate provided with an amorphous semiconductor layer, includes the step of cooling a part between the amorphous semiconductor layer and a thermocompression bonding part disposed between the input/output terminals and the external circuit on the substrate, by using nitrogen gas discharged from a cooling medium discharging nozzle 3 serving as a cooling medium supplying means. However, the arrangement of the present invention is not particularly limited.

For example, as will be described later, the following method is also applicable: an end of the amorphous semiconductor layer in the vicinity of the heating head 5 is mainly cooled in order to keep the cooling medium discharging nozzle 3 away from the heating head 5 serving as a thermocompression bonding means. Here, in the present embodiment, those members that have the same functions and that are described in Embodiment 1 are indicated by the same reference numerals and the description thereof is omitted.

Figure 4:
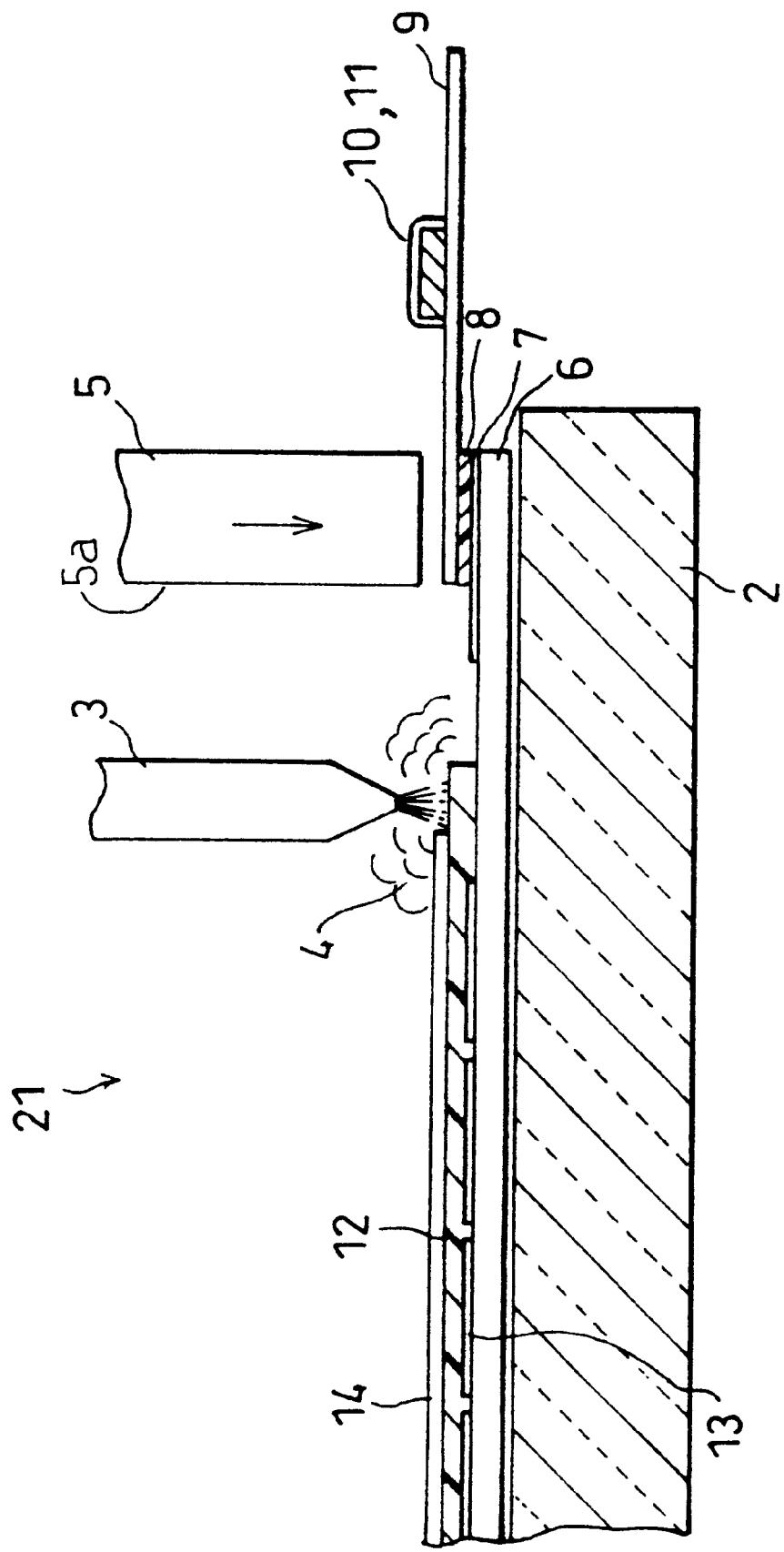
FIG. 4 is an explanatory drawing showing an external circuit packaging method for a two-dimensional image detector in accordance with another embodiment of the present invention.

FIG. 4 is an explanatory drawing showing an external circuit packaging method of the present embodiment. As shown in FIG. 4, in a thermocompression bonding apparatus 21, a cooling medium discharging nozzle 3 is disposed so as to mainly cool the end of the a-Se film 12 in the vicinity of the heating head 5.

As described in Embodiment 1, when a part between a thermocompression bonding part 8 and an a-Se film 12 is cooled by a cooling medium 4 discharged from a cooling medium supplying means such as the cooling medium discharging nozzle 3, in the case of a short distance between the input/output terminals 7 and the a-Se film 12 (for example, about 1 cm), the cooling medium discharging nozzle 3 comes too close to the heating head 5. Consequently, the heating head 5 and the thermocompression bonding part 8 may be cooled by the cooling medium 4.

Therefore, in the external circuit packaging method of the present embodiment, when the external circuits are packaged, a part of the a-Se film 12 in the vicinity of the input/output terminals 7, to be specific, the end of the a-Se film 12 in the vicinity of the heating head 5, is mainly cooled. Here, in this case as well, like Embodiment 1, the order of the cooling and the packaging, a cooling temperature, a cooling time, an amount of the supplied cooling medium 4 and other cooling conditions can be arranged arbitrarily so as to effectively interrupt heat conduction from the heating head 5 to the a-Se film 12 and to maintain a temperature of the a-Se film 12 layer below its crystallizing temperature.

According to the above method, a starting point of heat conduction from the heating head 5 on the a-Se film 12 (namely, a starting point of heat conduction from the thermocompression bonding part 8) is cooled, so that at the starting point of heat conduction from the heating head 5 on the a-Se film 12, most of heat can be removed before the heat is conducted to the inside of the a-Se film 12. Hence, it is possible to efficiently suppress heat conduction from the heating head 5 to the a-Se film 12 and to efficiently suppress a temperature increase of the a-Se film 12, that is caused by heat conducted from the thermocompression bonding part 8. Therefore, this method makes it possible to maintain a temperature of the a-Se film 12 below its crystallizing temperature during the thermocompression bonding, thereby preventing exfoliation of the a-Se film 12 and degradation in characteristics thereof during the packaging of the external circuits.

Further, when the above external circuit packaging method is used for connecting the active-matrix substrate 6 and the TCP substrates 9, it is possible to prevent the cooling medium discharging nozzle 3 from coming too close to the heating head 5. It is therefore possible to prevent the heating head 5 from being cooled by the cooling medium 4; consequently, the heating of the anisotropic conductive adhesive is not interrupted on the thermocompression bonding part 8. Hence, this method makes it possible to prevent crystallization of the amorphous semiconductor layer, namely, degradation in characteristics thereof while minimizing the cooling of the heating head 5, particularly in the case of a short distance, namely, a short gap of about 1 cm between the input/output terminals 7 and an end of the amorphous semiconductor layer in the vicinity of the heating head 5, on the active-matrix substrate 6.

EMBODIMENT 3

Figure 5:
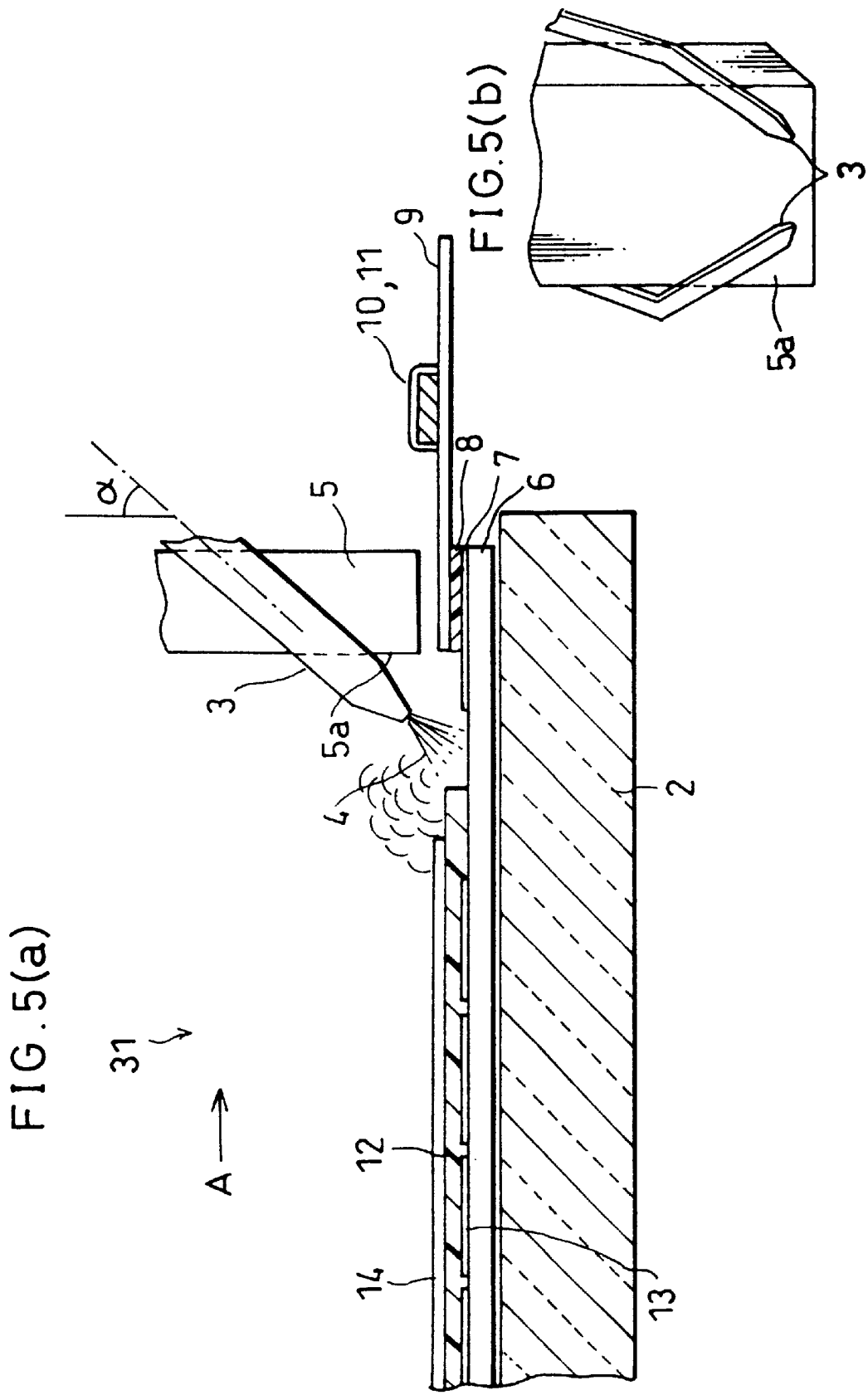
FIG. 5($a$) is an explanatory drawing showing an external circuit packaging method for a two-dimensional image detector in accordance with another embodiment of the present invention.

Referring to FIGS. 5(a) and 5(b), the following explanation describes the detail of the present embodiment.

Here, in the present embodiment, those members that have the same functions and that are described in Embodiment 1 or 2 are indicated by the same reference numerals and the description thereof is omitted. The present embodiment discusses another method for cooling an amorphous semiconductor layer while further suppressing the cooling of a heating head 5 by a cooling medium 4.

FIG. 5(a) is an explanatory drawing showing an external circuit packaging method of the present embodiment. FIG.

5(b) is a drawing showing a positional relationship between the heating head 5 and cooling medium discharging nozzles 3 taken in a direction of arrow A shown in FIG. 5(a).

As shown in FIG. 5(a), in a thermocompression bonding apparatus 31 of the present embodiment, tops of the cooling medium discharging nozzles 3 are inclined downward from input/output terminals 7 to an a-Se film 12.

The cooling medium discharging nozzles 3 are fixed such that a main axis direction of the cooling medium discharging nozzle 3, that is shown in a chain line, in other words, a direction of discharging the cooling medium 4 from the nozzle is inclined by α° relative to the length of the heating head 5, namely, the normal to a stage 2. Additionally, the cooling medium discharging nozzles 3 are fixed so as to be inclined from the side of the input/output terminals 7 while keeping its inclination, such that the tops of the nozzles are positioned so as to discharge the cooling medium 4 to a part of the a-Se film 12 in the vicinity of the heating head 5.

Furthermore, as shown in FIG. 5(b), when the cooling medium discharging nozzles 3 are seen from the side of the a-Se film 12, namely, when the cooling medium discharging nozzles 3 are seen in a direction of arrow A shown in FIG. 5(a), the two cooling medium discharging nozzles 3 are disposed so as to hold a surface 5a of the heating head 5, that faces the a-Se film 12, from both sides of the surface 5a. Namely, the two cooling medium discharging nozzles 3 are inclined such that the tops (tops of nozzles) are not in parallel with an active-matrix substrate 6 and the cooling medium 4 is discharged onto a line perpendicular to a base of the surface 5a around the center of the base of the surface 5a in a case where the cooling medium discharging nozzles 3 are seen in the direction of arrow A.

Regarding a degree of inclination of the heating head 5, it is more preferable to set the angle α between 20° and 80°, which the normal direction to the stage 2 forms with the direction of discharging the cooling medium 4 from the cooling medium discharging nozzles 3. The angle α is set within the range so as to efficiently discharge the cooling medium 4 away from the heating head 5. Here, when α is less than 20°, the cooling medium 4 is more likely to be discharged to the heating head 5. Further, when α is more than 80°, it is difficult to dispose the cooling medium discharging nozzles 3 due to the existence of the stage 2.

As described above, the cooling medium discharging nozzles 3 are disposed such that the direction of discharging the cooling medium is arranged diagonally, namely, with a predetermined angle α relative to the normal direction to the stage 2. With this arrangement, the cooling medium 4 is discharged from the input/output terminals 7 toward the a-Se film 12 with directivity (acceleration), so that most of the cooling medium 4 discharged to a surface of the two-dimensional image detector is discharged away from the heating head 5. Therefore, according to this method, it is possible to prevent the heating head 5 and the thermocompression bonding part 8 from being cooled by the cooling medium 4 discharged from the medium discharging nozzles 3, to efficiently carry out a thermocompression bonding, and to efficiently suppress an increase in temperature of the a-Se film 12 so as to prevent crystallization of the a-Se film 12.

As mentioned above, with the external circuit packaging method of the present embodiment, the cooling medium 4 is diagonally supplied, namely, the cooling medium 4 is supplied from the side of the input/output terminals 7 to the a-Se film 12 serving as the amorphous semiconductor layer, so that it is possible to prevent the cooling medium 4 from being brought to the thermocompression bonding part 8.

Consequently, a desired area other than the thermocompression bonding part 8 can be cooled while the cooling effect to the thermocompression bonding part 8 is kept to a minimum, so that the thermocompression bonding can be further efficiently carried out.

EMBODIMENT 4

In Embodiments 1 to 3, a discharging mechanism for a cooling medium 4, namely, cooling liquid discharging nozzles 3, are used for maintaining a temperature of an amorphous semiconductor layer below its crystallizing temperature during a thermocompression bonding. The present embodiment involves a method for using a cooling member contact mechanism (cooling/heat-dissipating mechanism) provided with a cooling head, which serves as a cooling member for making contact with a place and cooling it, as a method for maintaining a temperature of the amorphous semiconductor layer below its crystallizing temperature during a thermocompression bonding. Here, in the present embodiment, those members that have the same functions and that are described in Embodiment 1 to 3 are indicated by the same reference numerals and the description thereof is omitted. maintaining a temperature of the amorphous semiconductor layer below its crystallizing temperature during a thermocompression bonding. Here, in the present embodiment, those members that have the same functions and that are described in Embodiment 1 to 3 are indicated by the same reference numerals and the description thereof is omitted.

Figure 6:
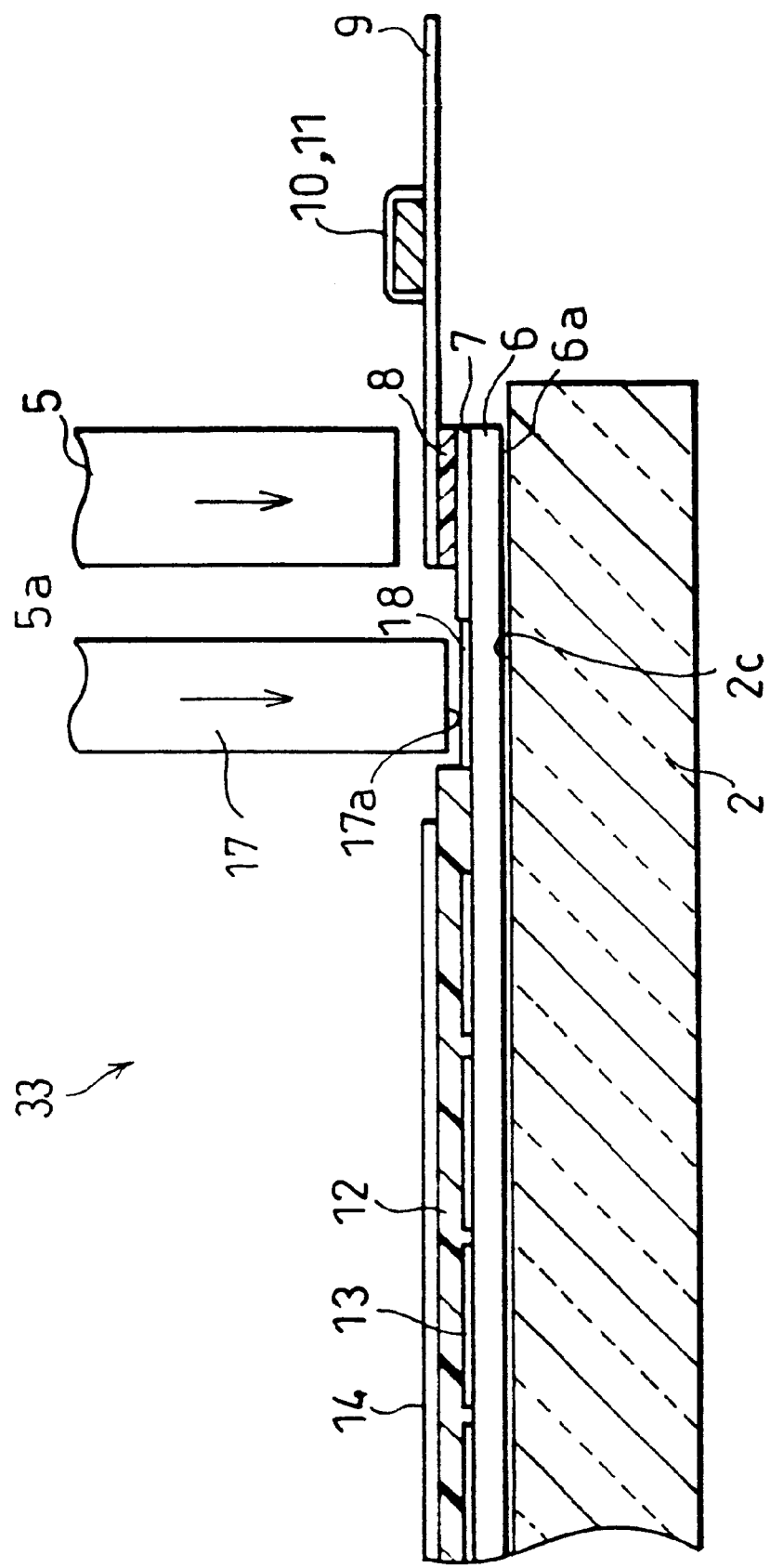
FIG. 6 is an explanatory drawing showing an external circuit packaging method for a two-dimensional image detector in accordance with still another embodiment of the present invention.

FIG. 6 is an explanatory drawing showing the external circuit packaging method of the present embodiment. As shown in FIG. 6, a thermocompression bonding 33 of the present embodiment is provided with a cooling head 17 instead of the cooling liquid discharging nozzle 3 described in Embodiments 1 to 3. The cooling head 17 cools a desired place of a two-dimensional image detector by making contact. The cooling head 17 is a metallic block formed into a rectangular solid which is virtually identical in shape to a heating head 5 (see FIGS. 5(a) and 5(b)) used in a thermocompression bonding. Like the heating head 5, the cooling head 17 ascends and descends at a desired timing by an ascending/descending mechanism including an air cylinder. Namely, the cooling member contact mechanism of the present embodiment is constituted by the cooling head and the heat cooling head ascending/descending mechanism including the air cylinder. Moreover, the cooling head 17 is formed by a metallic block made of a material such as copper, which is superior in heat conduction, and one of the ends (end being opposite to an end 17a, which makes contact with an active-matrix substrate 6) undergoes a cooling and/or heat-dissipating operation by using a cooling medium such as water, a heat-dissipating plate, a air-cooling fan, a Peltier device, and others.

The thermocompression bonding apparatus 33 has a construction in which the cooling head 17 is disposed between the heating head 5 and the a-Se film 12 in parallel with the heating head 5. In the thermocompression bonding apparatus 33, the end 17a at the top of the cooling head 17 enters and makes a contact in a gap between a surface 5a of the heating head 5 in the vicinity of the a-Se film 12, and the a-Se film 12 on the active-matrix substrate 6, to be specific, between input/output terminals 7 and the a-Se film 12 on the active-matrix substrate 6.

The following explanation discusses the detail of the thermocompression bonding step according to the present embodiment, by taking as an example a final pressing and bonding step of TCP substrates 9 to the active-matrix substrate 6.

Firstly, as shown in FIG. 6, the two-dimensional image detector, in which the a-Se film 12 serving as the amorphous semiconductor layer is formed on the active-matrix substrate 6, is disposed on a stage 2 of the thermocompression bonding apparatus 33 in a state in which the input/output terminals 7 are provided on an upper surface of the active-matrix substrate 6. According to this arrangement, the active-matrix substrate 6 is disposed on the stage 2 such that a surface 6a, on which members including the a-Se film 12 are not provided, is brought into contact with an upper surface 2c of the stage 2. A step of temporarily bonding the active-matrix substrate 6 and the TCP substrate 9 can be previously carried out as described in Embodiment 1, or the step can be included in a series of the steps of the above thermocompression bonding.

Next, on the active-matrix substrate 6, on which the TCP substrates 9 are temporarily pressed and bonded, the cooling head 17 is shifted downward in a vertical direction by the air cylinder (not shown) to the gap between the a-Se film 12 and the input/output terminals 7 provided in a surrounding part of the active-matrix substrate 6, and the end 17a of the cooling head 17 is brought into contact with the gap.

In this state, the heating head is shifted downward (the normal direction to the active-matrix substrate 6; a direction of an arrow indicated on the cooling head 17 of FIG. 6) by the air cylinder (not shown), and a pressure between 9.8 mPa and 29.4 mPa (10 to 30 kgf/cm$^2$) is applied to an ACF via the TCP substrates 9. Further, at the same time, the ACF is heated via the TCP substrates 9 by the heating head 5 under the condition of about 170° C.×20 seconds. Thus, the ACF is heated while being pressurized by the heating head 5, and a packaging is completed after the ACF is cured by heat and bonded. Here, after the packaging, the heating head 5 and the cooling head 17 are shifted upward in a vertical direction by the air cylinder.

As described above, in the present embodiment, while the cooling head 17 cools the gap between the a-Se film 12 and the input/output terminals 7 provided in the surrounding part of the active-matrix substrate 6, as mentioned above, the TCP substrates 9 are connected to the input/output terminals 7 by performing a thermocompression bonding on the ACF by using the heating head 5, namely, the external circuits are packaged.

According to this arrangement, the cooling operation is performed from the input/output terminals 7 to the a-Se film 12 by the cooling head 17 on the active-matrix substrate 6. Thus, most heat can be removed before the heat is conducted to the a-Se film 12. For this reason, unlike the conventional external circuit packaging method, when the ACF is cured, a temperature of the a-Se film 12 is not increased to the crystallizing temperature or more even in the case where heat is applied to the heating head 5 and is conducted to the amorphous semiconductor layer.

When the TCP substrates 9 are bonded to the input/output terminals 7 in a surrounding part of the active matrix substrate 6 by a thermocompression bonding according to the above external circuit packaging method, the temperature is measured on an end of the a-Se film 12 that is the closest to the input/output terminals 7. It is confirmed that the temperature is increased to no more than about 30 or 40° C. at the position (the end) of the a-Se film 12. Hence, accordingly to this method, the temperature of the a-Se film 12 can be maintained below its crystallizing temperature during the thermocompression bonding.

Meanwhile, upon packaging, when the cooling operation with the cooling head 17 is not performed, the temperature of the end is increased to about 90° C.

When the active-matrix substrate 6 is connected to the TCP substrates 9 according to the external circuit packaging method, it is easy to accurately set a desired position to be cooled on the active-matrix substrate 6, as compared with the constructions of Embodiments 1 to 3, in which the active-matrix substrate 6 is cooled by the cooling medium 4 such as gas. This is because in the case of the cooling head 17 composed of a metallic block, it is possible to accurately cool only a contact part of the cooling head 17, namely, the metallic block; thus, unlike the construction in which the active-matrix substrate 6 is cooled by the cooling medium 4 such as gas, the cooling medium 4 supplied onto the active-matrix substrate 6 is not dispersed thereon, thereby accurately cooling a smaller area. Moreover, the cooling medium 4 is not likely to interrupt the heating or an anisotropic conductive adhesive on the thermocompression bonding part 8.

Therefore, according to this method, when the distance is short between the input/output terminals 7 and an end of the amorphous semiconductor layer in the vicinity of the heating head 5; namely, the distance is only about 1 cm in the gap, it is possible to prevent crystallization of the amorphous semiconductor layer. In other words, degradation of the amorphous semiconductor layer can be prevented while minimizing the cooling of the heating head 5.

Additionally, it is more preferable to perform the cooling operation in the temporary pressing and bonding step as well as the final one.

Furthermore, the present embodiment discusses the construction in which the packaging is completed after the cooling operation is started by shifting the cooling head 17 downward in a vertical direction so as to bring the end 17a of the cooling head 17 into contact with the gap. However, the order of the cooling and the packaging can be arranged arbitrarily in accordance with a length of the gap, a crystallizing time of the amorphous semiconductor layer, a heating temperature of the heating head 5, a material of the cooling head 17, cooling means, and other conditions. As long as a temperature of the amorphous semiconductor layer is maintained below its crystallizing temperature during the thermocompression bonding, the order of the cooling and the packaging is not particularly limited.

Therefore, for instance, the packaging and the cooling can be simultaneously started, or the cooling can be started after the packaging is started. In the present embodiment, to more effectively interrupt the heat conduction from the heating head 5 to the amorphous semiconductor layer, it is particularly preferable to start the packaging after the cooling is started. This is because a temperature of a desired area can be sufficiently lowered and a temperature increase can be suppressed with ease by starting the cooling before the heating operation of the packaging.

The cooling temperature and time of the cooling head 17 are not particularly limited as long as a temperature of the amorphous semiconductor layer (a-Se film 12 in the present embodiment) is not increased to a temperature or more where its crystallization is started (crystallizing temperature). Also, the size of the head 17 can be set arbitrarily in accordance with the size of the cooled area and the cooling position. In other words, the cooling conditions such as a cooling temperature, a cooling time, and the size of the cooling head are determined by a kind of the amorphous semiconductor layer, the size, a distance between the amorphous semiconductor layer and the thermocompression bonding part 8, a cooling position, a material of the cooling head 17, a cooling means, and others so as to effectively interrupt heat conduction from the heating head 5 to the amorphous semiconductor layer and to maintain a temperature of the amorphous semiconductor layer below its crystallizing temperature.

Moreover, FIG. 6 shows that the cooling head 17 cools the gap between the a-Se film 12 and the thermocompression bonding part 8 disposed between the external circuits and the input/output terminals 7 disposed on the active-matrix substrate 6. However, the present invention is not particularly limited to this arrangement. For instance, the following method is also available: in order to keep the cooling head 17 away from the heating head 5 serving as a thermocompression bonding means, the end of the a-Se film 12 in the vicinity of the heating head 5 is mainly cooled, namely, a part of the a-Se film 12 in the vicinity of the input/output terminals 7 is mainly cooled.

Figure 7:
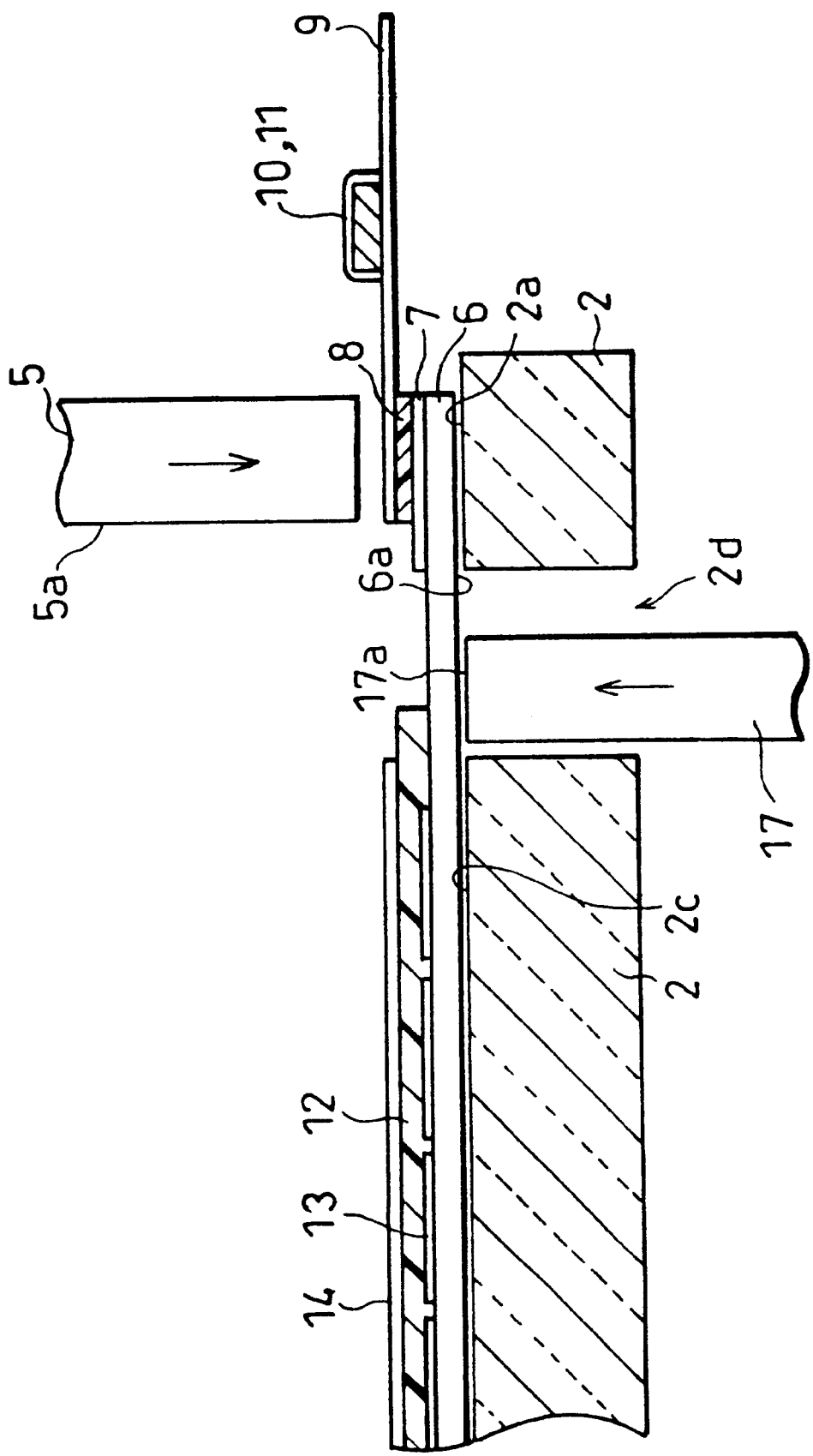
FIG. 7 is an explanatory drawing showing an external circuit packaging method for a two-dimensional image detector in accordance with still another embodiment of the present invention.

In this case, as shown in FIG. 7, an area corresponding to a cooled area on the stage 2 (namely, the part of the a-Se film 12 in the vicinity of the input/output terminals 7) is partially opened so as to form a space 2d on the stage 2, and the end 17a of the cooling head 17 is inserted into the space 2d so as to bring the end 17a into contact with the surface 6a of the active-matrix substrate 6. The surface 6a is not provided with the a-Se film 12 and others. This arrangement makes it possible to mainly cool the part of the a-Se film 12 in the vicinity the input/output terminals 7 by using the cooling head 17. Here, a method is not particularly limited for partially opening the area corresponding to the cooled area on the stage 2. For example, the area of the stage 2, that corresponds to the cooled area of the active-matrix substrate 6, can be hollowed to form a through hole in the area, or the stage 2 can be constituted by two different members.

Additionally, in this case as well, the order of the cooling and the packaging, a cooling temperature, a cooling time, an amount of the supplied cooling medium 4 and other cooling conditions can be arranged arbitrarily so as to effectively interrupt heat conduction from the heating head 5 to the a-Se film 12 and to maintain a temperature of the a-Se film 12 layer below its crystallizing temperature.

According to this method, a starting point of heat conduction from the heating head 5 on the a-Se film 12 (namely, a starting point of heat conduction from the thermocompression bonding part 8) is cooled, so that at the starting point of heat conduction from the heating head 5 on the a-Se film 12, most heat can be removed before the heat is conducted to the inside of the a-Se film 12. Hence, it is possible to efficiently suppress heat conduction from the heating head 5 to the a-Se film 12 and to efficiently suppress the temperature increase of the a-Se film 12, that is caused by heat conducted from the thermocompression bonding part 8. Therefore, this method makes it possible to maintain the temperature of the a-Se film 12 below its crystallizing temperature during the thermocompression bonding, thereby preventing exfoliation of the a-Se film 12 and degradation in characteristics thereof during the packaging of the external circuits.

Here, when a cooling operation is performed on the part between the a-Se film 12 and the thermocompression bonding part 8 disposed between the external circuits and the input/output terminals 7 on the active-matrix substrate 6, as described above, it is possible to directly cool the back of the active-matrix substrate 6 instead of the upper surface thereof.

When the active-matrix substrate 6 is cooled from the back, the size of the cooling head 17 is adjusted so as to widely cool the active-matrix substrate 6. For example, the cooling operation can be performed a) from the part between the a-Se film 12 and the thermocompression bonding part 8 disposed between the external circuits and the input/output terminals 7 on the active-matrix substrate 6 b) to the part of the a-Se film 12 in the vicinity of the input/output terminals 7, or c) to the center of the a-Se film 12. Hence, according to this method, it is possible to widen the range of choices in the size of the cooling head 17 so as to prevent crystallization of the a-Se film 12, namely, deterioration in characteristics by the cooling head 17, regardless of a distance between the a-Se film 12 and the input/output terminals 7 on the active-matrix substrate 6. Additionally, with the cooling head 17, unlike the construction in which the cooling medium 4 is discharged in a gas state onto the active-matrix substrate 6, the cooling medium 4 is not dispersed and the heating head 5 is not cooled by the cooling medium 4. Thus, the heating of the anisotropic conductive adhesive is not interrupted on the thermocompression bonding part 8. Consequently, it is possible to efficiently suppress crystallization of the a-Se film 12, namely, deterioration in characteristics while minimizing the cooling of the thermocompression bonding part 8.

When the cooling head 17 is brought into contact with the active-matrix substrate 6, the end 17a of the cooling head 17 can be directly in contact with the active-matrix substrate 6, or as shown in FIG. 6, a cushioning material 18, which is formed into a sheet or a plate with excellent heat conduction, can be disposed between the end 17a of the cooling head 17 and the active-matrix substrate 6, in order to absorb shock energy caused by the contact of the cooling head so as to protect the active-matrix substrate 6. As a material of the cushioning material 18, it is possible to adopt a material such as a carbon sheet and a silicon sheet, in which a heat conductive pigment is dispersed.

Moreover, the present embodiment discusses the construction in which the cooling head 17 is used as a cooling member for cooling a contact part by making contact. The cooling head 17 is composed of a metallic block having excellent heat conduction, and one of the ends undergoes a cooling and/or heat-dissipating operation by using a cooling medium such as water, a heat-dissipating plate, a air-cooling fan, a Peltier device, and others. The cooling member is not particularly limited as long as it is capable of cooling a contact part by making contact. For example, it is possible to adopt a cooling member in which a cooling medium passes through or circulates, and a cooling solid which is cooled by itself.

As a cooling medium used for the end or the inside of the cooling member, it is possible to adopt a variety of cooling mediums including a CFC substitute agent, compressed air used in a plant, various kinds of cooling gases, liquid with high volatility, and a cooling solid as well as water.

EMBODIMENT 5

Embodiments 1 to 3 relate to the construction in which a discharging mechanism of a cooling medium 4, namely, a cooling liquid discharging nozzle 3 is used to maintain a temperature of an amorphous semiconductor layer below its crystallizing temperature during a thermocompression bonding. Further, in Embodiment 4, a cooling head contact mechanism is used as a cooling member contact mechanism to maintain a temperature of an amorphous semiconductor layer below its crystallizing temperature during a thermocompression bonding. The present embodiment describes a method for performing a cooling or heat-dissipating operation on a substrate placement part, which is placed while an amorphous semiconductor layer forming section performs a thermocompression bonding on a substrate, so as to maintain a temperature of an amorphous semiconductor layer below its crystallizing temperature. Here, in the present embodiment, those members that have the same functions and that are described in Embodiments 1 to 4 are indicated by the same reference numerals and the description thereof is omitted.

The present embodiment mainly describes the following construction: a stage 2 (substrate placing section), on which a two-dimensional image detector is placed, is provided with a cooling/heat-dissipating mechanism and a cooling and/or heat-dissipating operation is performed on the stage 2 by the cooling/heat-dissipating mechanism, in order to maintain a temperature of an amorphous semiconductor layer below its crystallizing temperature during a thermocompression bonding.

Figure 8:
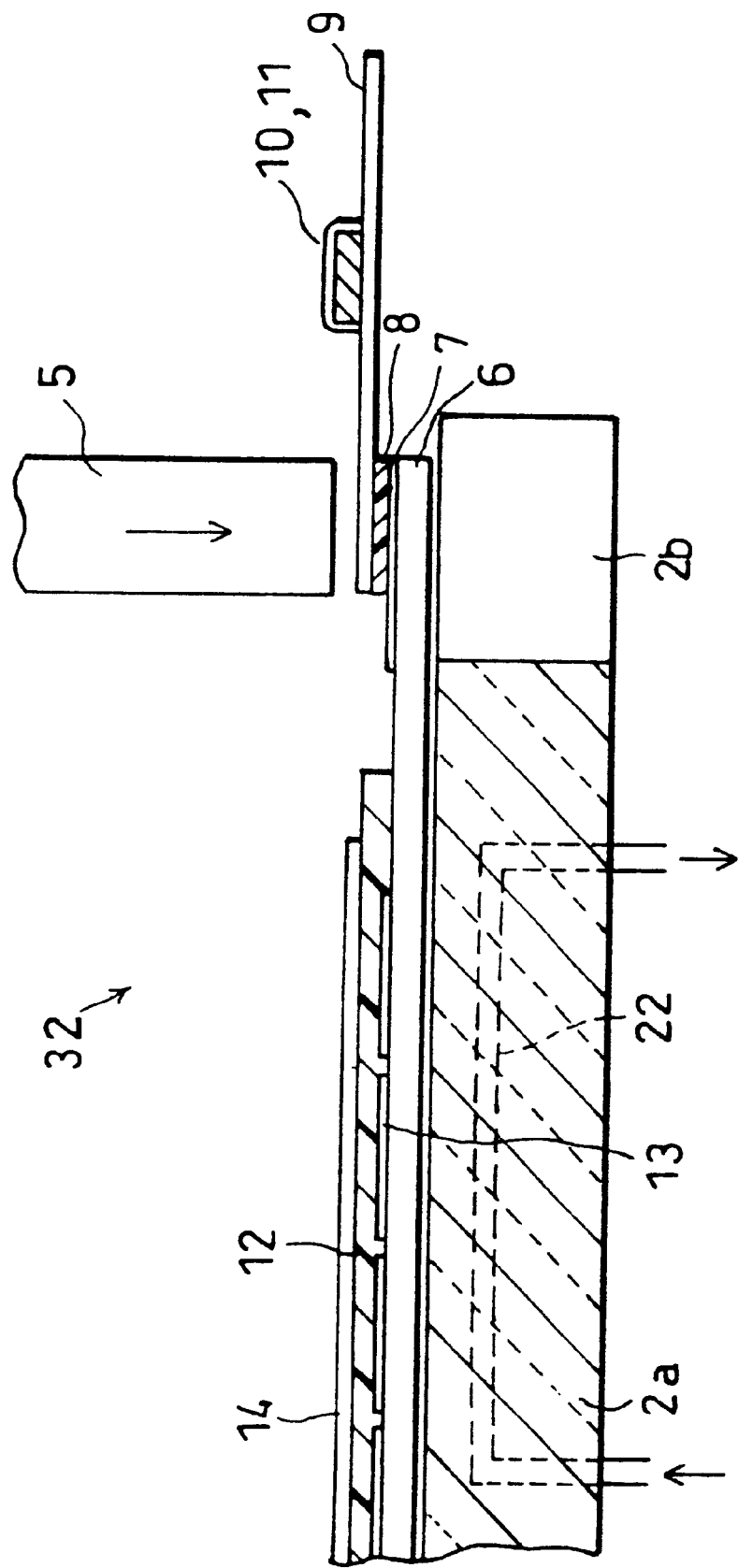
FIG. 8 is an explanatory drawing showing an external circuit packaging method for a two-dimensional image detector in accordance with still another embodiment of the present invention.

FIG. 8 is an explanatory drawing showing an external circuit packaging method of the present embodiment. As shown in FIG. 8, a thermocompression bonding apparatus 32 includes a cooling medium circulating mechanism as a cooling medium supplying means (cooling mechanism) inside the stage 2, on which the two-dimensional image detector is placed. The cooling medium circulating mechanism is provided with a tube-type through hole 22 composed of an inlet for admitting the cooling medium 4 and an outlet for discharging out the cooling medium 4. In the present embodiment, the through hole 22 is provided on an area (stage 2a described later) corresponding to a placement area 16 of an a-Se film 12 in the two-dimensional image detector placed on the stage 2. The shape of the through hole 22 is not particularly limited. For example, the through hole 22 can be formed by a number of straight tubes disposed in parallel with one another, or a plane tube disposed in parallel with the stage 2 (stage 2a).

The cooling medium 4 is not particularly limited as long as it is cooling liquid with a cooling capability. For example, it is possible to use liquid such as cooled water and ammonia water. Here, cooled water is more preferable because it can be supplied with ease at low cost.

With this cooling mechanism, the cooling medium 4 passes through the through hole 22 so as to cool the stage 2 on the placement area of the through hole 22. Thus, it is possible to cool the placement area of the through hole 22 in the two-dimensional image detector disposed on the stage 2, namely, the placement area 16 of the a-Se film 12 in the present embodiment. Further, according to this arrangement, the two-dimensional image detector which undergoes a thermocompression bonding is disposed such that a surface of the active-matrix substrate 6 and a surface of the stage 2 are in parallel with each other. Only with this arrangement, it is possible to suppress an increase in temperature of the a-Se film 12, which is formed on the active-matrix substrate 6 of the two-dimensional image detector, by cooling the stage 2. Consequently, it is possible to efficiently and readily maintain a temperature of the a-Se film 12 below its crystallizing temperature.

Additionally, to dissipate heat of the stage 2, another method can be adopted in which a space is provided so as to correspond to an area of the active-matrix substrate 6, that undergoes a heat-dissipating and/or a cooling operation on the stage 2. FIG. 8 shows that the stage 2a and the stage 2b are connected to each other. To minimize heat conduction between the amorphous semiconductor layer (in this case, the a-Se film 12) and a thermocompression bonding part 8 disposed between the TCP substrates 9 and the input/output terminals 7 on the active-matrix substrate 6, a space (gap) is provided between a)a part of the stage 2 (stage 2b), that has the input/output terminals 7 of the two-dimensional image detector thereon and b)the other part (stage 2a). Thus, it is possible to prevent heat conduction from the stage 2b to the stage 2a and to dissipate heat on the area of the active-matrix substrate 6 that corresponds to the space.

In this case, the space can be formed as follows: a groove or a concave is formed on an area corresponding to the area of the active-matrix substrate 6, that undergoes a cooling and/or heat-dissipating operation; the area is hollowed to form a through hole; or the stage 2 is, for example, divided into two members, which are disposed separately so as to make a partial opening on the stage 2.

Furthermore, in this case, as shown in FIG. 8, the above-mentioned cooling medium circulating mechanism is provided on the stage 2 so as to more efficiently cool the stage 2a.

Moreover, the thermocompression bonding apparatus 32 further preferably includes the stage 2 with a construction in which a material differs between a) the part on which the input/output terminals 7 of the two-dimensional image detector are disposed and b)the other part, to be specific, the placement area 16 of the a-Se film 12 serving as the amorphous semiconductor layer.

To be specific, a part of the stage 2 (stage 2b), that has the input/output terminals 7 of the two-dimensional image detector, is made of a material (material B) such as a ceramic and stainless material and a variety of heat insulators with relatively low heat conduction.

Meanwhile, the other part, namely, a part (stage 2a) except for the part of the stage 2, that has the input/output terminals 7 of the two-dimensional image detector, is made of a material (material A) such as copper (Cu), which is superior to the material B in heat conduction.

Here, the heat conduction refers to heat conductivity, in other words, a quantity of heat [unit: $W \cdot m^{-1} \cdot K^{-1}$] applied for 1 second through a 1 $m^2$ surface of a plate with a thickness of 1 m, in a case where a temperature differs by 1K between the surfaces of the plate. Copper serving as the material B has heat conductivity of 395 $W \cdot m^{-1} \cdot K^{-1}$ at 100° C. Further, among the ceramics used as the material B, quartz glass has heat conductivity of 1.9 $W \cdot m^{-1} \cdot K^{-1}$ at 100° C. Among stainless materials, 18-8 stainless steel has heat conductivity of 16.5 $W \cdot m^{-1} \cdot K^{-1}$ at 100° C.

In the present embodiment, the two-dimensional image detector is disposed on an upper surface of the stage 2a so as to include a part on which the a-Se film 12 of the two-dimensional image detector is formed.

According to this method, the material A is superior in heat conduction, so that the entire stage 2a or the upper part of the stage 2a can be efficiently cooled by the cooling medium 4. Consequently, it is possible to efficiently cool the a-Se film 12 of the two-dimensional image detector that is disposed on the stage 2a.

As described above, the stage 2 is made of the two kinds of materials including the material A and the material B; hence, when the heat-dissipating effect is developed via the stage 2 on the a-Se film 12 of the two-dimensional image detector, or when the cooling mechanism is used to cool the a-Se film 12 of the two-dimensional image detector via the stage 2, it is possible to more efficiently exert the cooling effect.

Moreover, the stage 2 is made of a plurality of materials that differ in heat conduction as mentioned above, so that heat conduction can be varied between a) the part (stage 2b) of the stage 2 that has the input/output terminals 7 of the two-dimensional image detector and b) the other part (stage 2a) so as to suppress heat conduction. Thus, as described above, the stage 2b is made of a material (material B) such as a heat insulator with relatively low heat conduction, and the other part is made of a material (material A) with excellent heat conduction, so that the cooling effect is less likely to be conducted in the stage 2b. Therefore, it is possible to minimize the cooling effect to the input/output terminals 7, and heat of the thermocompression bonding is less likely to be conducted to the stage 2a and the a-Se film 12 of the two-dimensional image detector disposed on the stage 2; consequently, it is possible to more efficiently suppress an increase in temperature of the a-Se film 12.

The combination of the materials used for the stage 2a and the stage 2b can be arbitrarily arranged. For example, with the combination of the material A including copper and the material B including ceramic and stainless materials, a desired area can be subjected to a cooling and/or heat-dissipating operation with a minimum cooling and heat-dissipating effect exerted on the thermocompression part 8.

Figure 9:
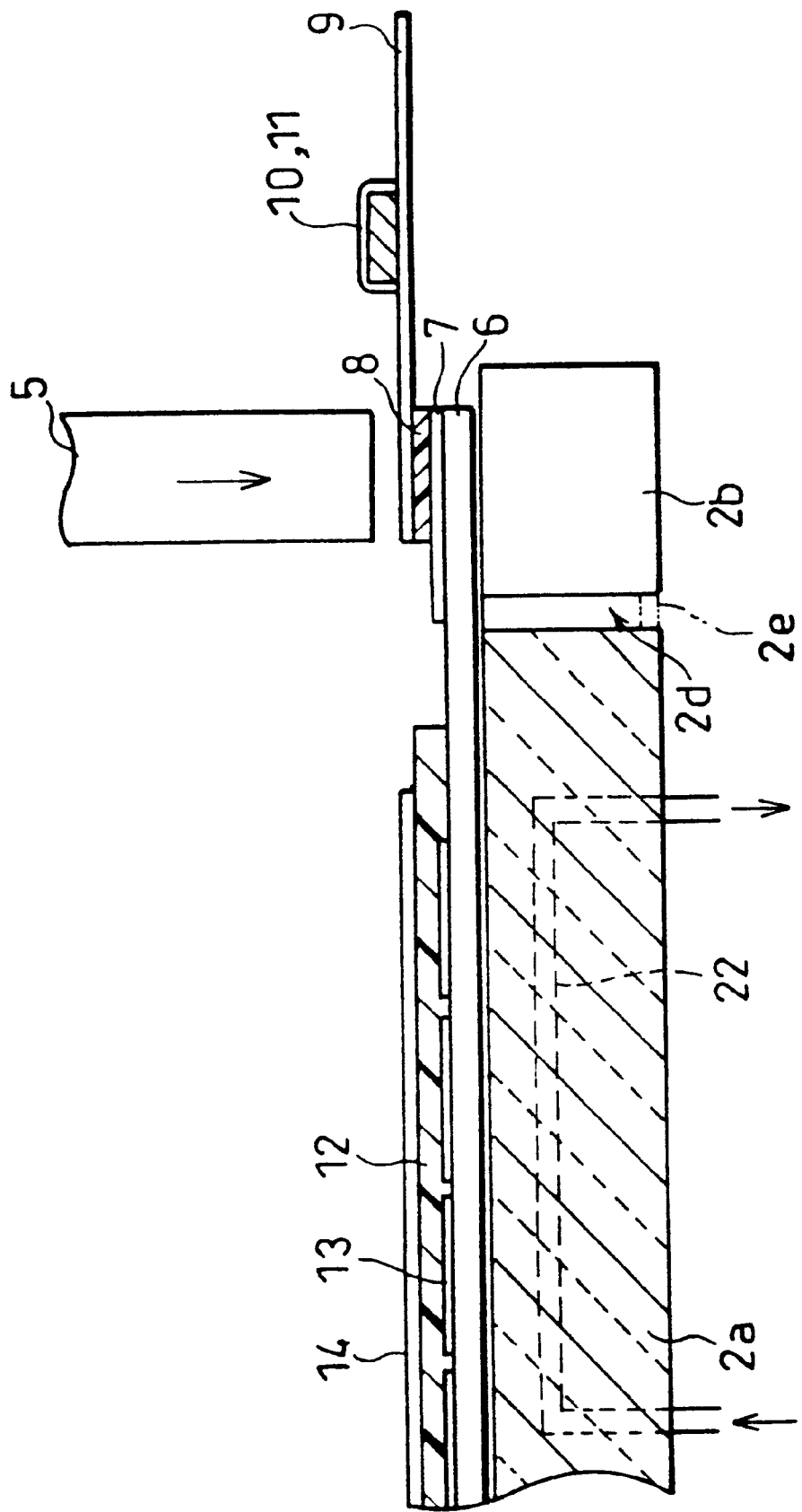
FIG. 9 is an explanatory drawing showing an external circuit packaging method for a two-dimensional image detector in accordance with still another embodiment of the present invention.

Furthermore, in the case of the stage 2 made of the two kinds of materials including the material A and the material B, as described above, it is more desirable that the thermocompression bonding apparatus 32 be provided with the space 2d shown in FIG. 9 between the stage 2a and the stage 2b in order to minimize the heat conduction between the stage 2a and the stage 2b constituting the stage 2. The width of the space 2d is determined by a distance between the a-Se film 12 and the thermocompression bonding part 8 disposed between the TCP substrates 9 and the input/output terminals 7 on the active-matrix substrate 6. In order to minimize the heat conduction between the stage 2a and the stage 2b constituting the stage 2, it is preferable to provide the space 2d with a width of about 5 to 10 mm.

Further, as mentioned above, when the stage 2a and the stage 2b are made of different materials, the stage 2a and the stage 2b can be connected to each other via a connecting member 2e as shown by phantom lines of FIG. 9. In other words, it is not always necessary to form the space 2d as a hole penetrating from the upper surface to the back of the stage 2. For example, the connecting member 2e connects the sides and the bases of the stage 2, so that a concave is formed on a cooling area of the stage 2. The stage 2a and the stage 2b are connected to each other via the connecting member 2e so as to always maintain the positional relationship between the stage 2a and the stage 2b.

As described above, the present embodiment describes the following construction as an example: in order to maintain a temperature of the a-Se film 12 below its crystallizing temperature during a thermocompression bonding, the stage 2 for mounting the two-dimensional image detector thereon includes the cooling/heat-dissipating mechanism, and the stage 2 is subjected to a cooling and/or heat-dissipating operation by the cooling mechanism. Here, in this example, the cooling medium supplying means is regarded as a cooling medium circulating mechanism; however, the cooling medium supplying means is not particularly limited; thus, it is not always necessary to circulate the cooling medium 4.

Moreover, in the above description, the through hole 22 included in the cooling medium supplying means is provided on the area corresponding to the placement area 16 of the a-Se film 12 in the two-dimensional image detector disposed on the stage 2; however, the placement area of the through hole 22 is not particularly limited. It is only necessary to dispose the through hole 22 in an area so as to perform a cooling and/or heat-dissipating operation at least on a part between the thermocompression bonding part 8 and the a-Se film 12 or a part of the a-Se film 12 in the vicinity of the input/output terminals 7, on the stage 2 during a thermocompression bonding. For instance, the through hole 22 can be disposed arbitrarily in accordance with conditions such as a heating condition and a cooling condition, on a part such as the part between the thermocompression bonding part 8 and the a-Se film 12, the part of the a-Se film 12 in the vicinity of the input/output terminals, an area corresponding to the placement area 16 of the a-Se film 12, and preferably an area corresponding to an area entirely including the placement area 16.

Further, in the present embodiment, the through hole 22 is formed inside the stage 2a made of the material A. However, the position of the through hole 22 is not particularly limited, so that the through hole 22 can be formed on the side or the back of the stage 2a. Moreover, the through hole 22 is partially exposed out of the stage 2a and is directly brought into contact with the active-matrix substrate 6 of the two-dimensional image detector. Thus, it is possible to cool both of the stage 2a and the active-matrix substrate 6 so as to further improve the cooling effect.

The through hole 22 can be formed by a variety of conventional methods as follows: a surface of the stage 2 is ground to form a penetrating tube serving as the through hole 22; a hollow is former in the stage 2 and a penetrating tube serving as the penetrating hole 22 is disposed therein; and the stage 2 is molded by using a metallic mold and injection molding to form the through hole 22 in the stage 2.

Additionally, during a thermocompression bonding, the construction for cooling the stage 2 is not particularly limited to the method using cooling liquid as the cooling medium 4. As a cooling medium for cooling the stage 2, it is possible to adopt a medium such as a CFC substitute agent, compressed air used in a plant, various kinds of cooling gases, liquid with high volatility, and a cooling solid.

Figure 10:
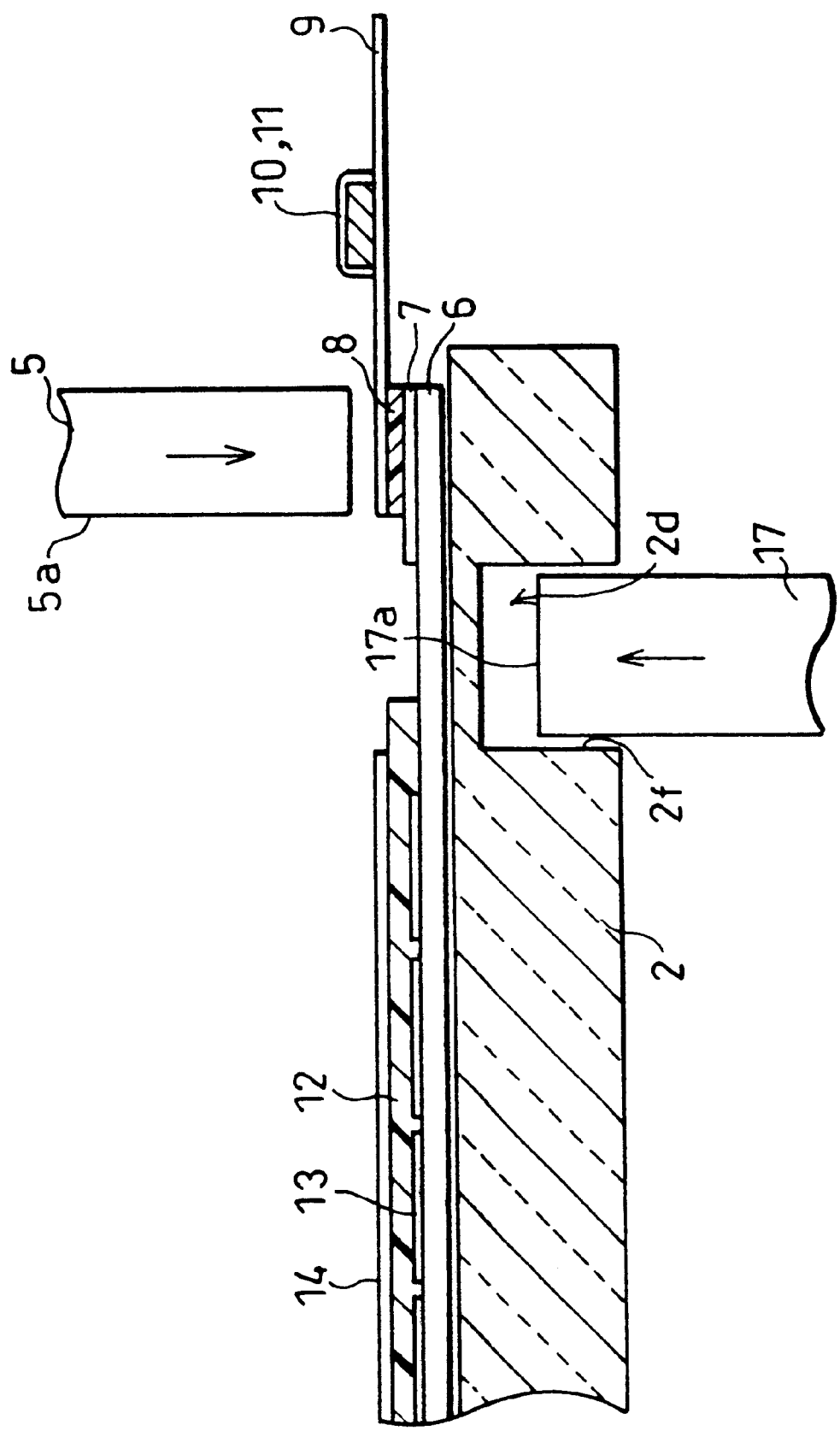
FIG. 10 is an explanatory drawing showing an external circuit packaging method for a two-dimensional image detector in accordance with still another embodiment of the present invention.
Figure 11:
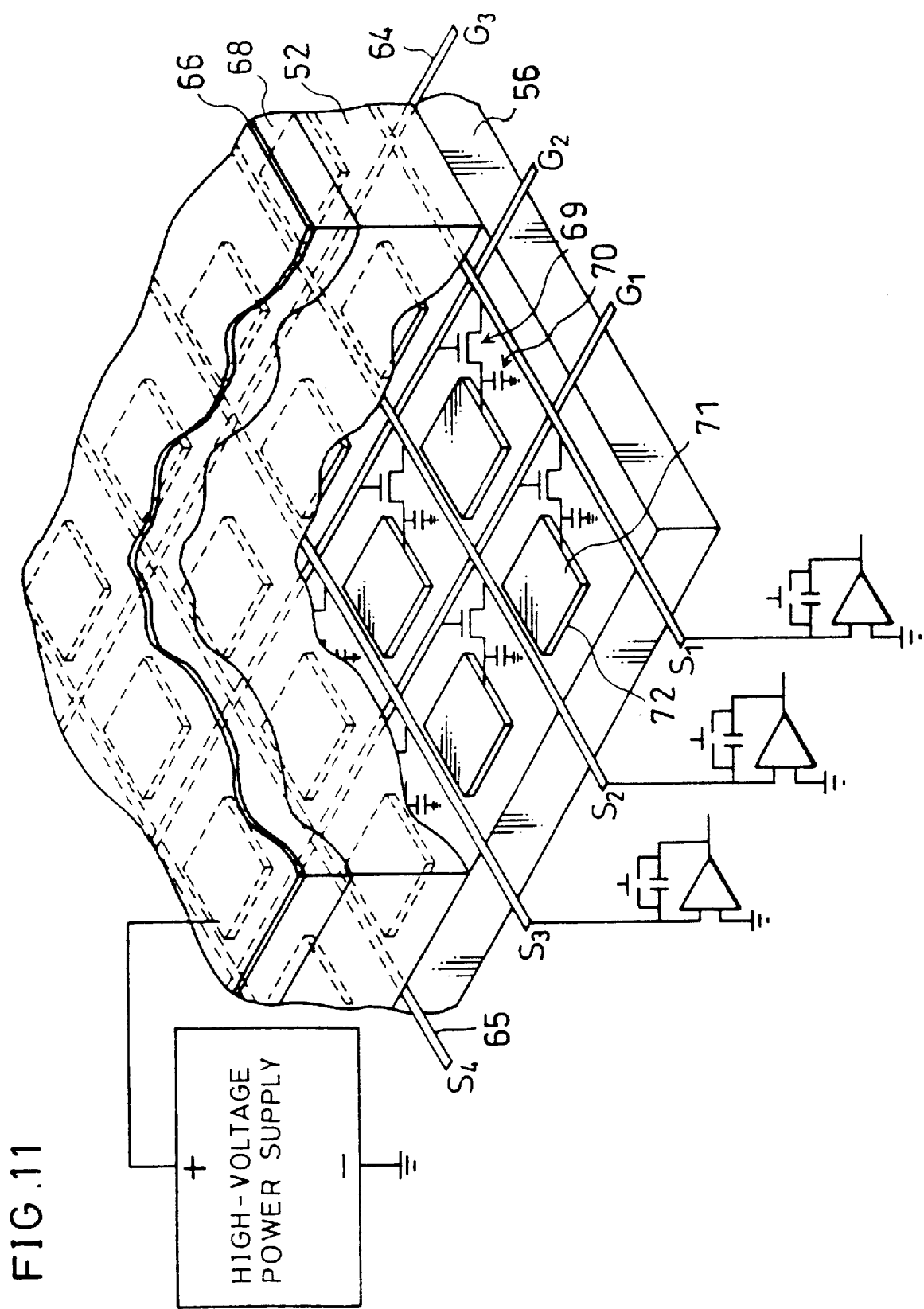
FIG. 11 is a perspective view showing the construction of a conventional two-dimensional image detector.
Figure 12:
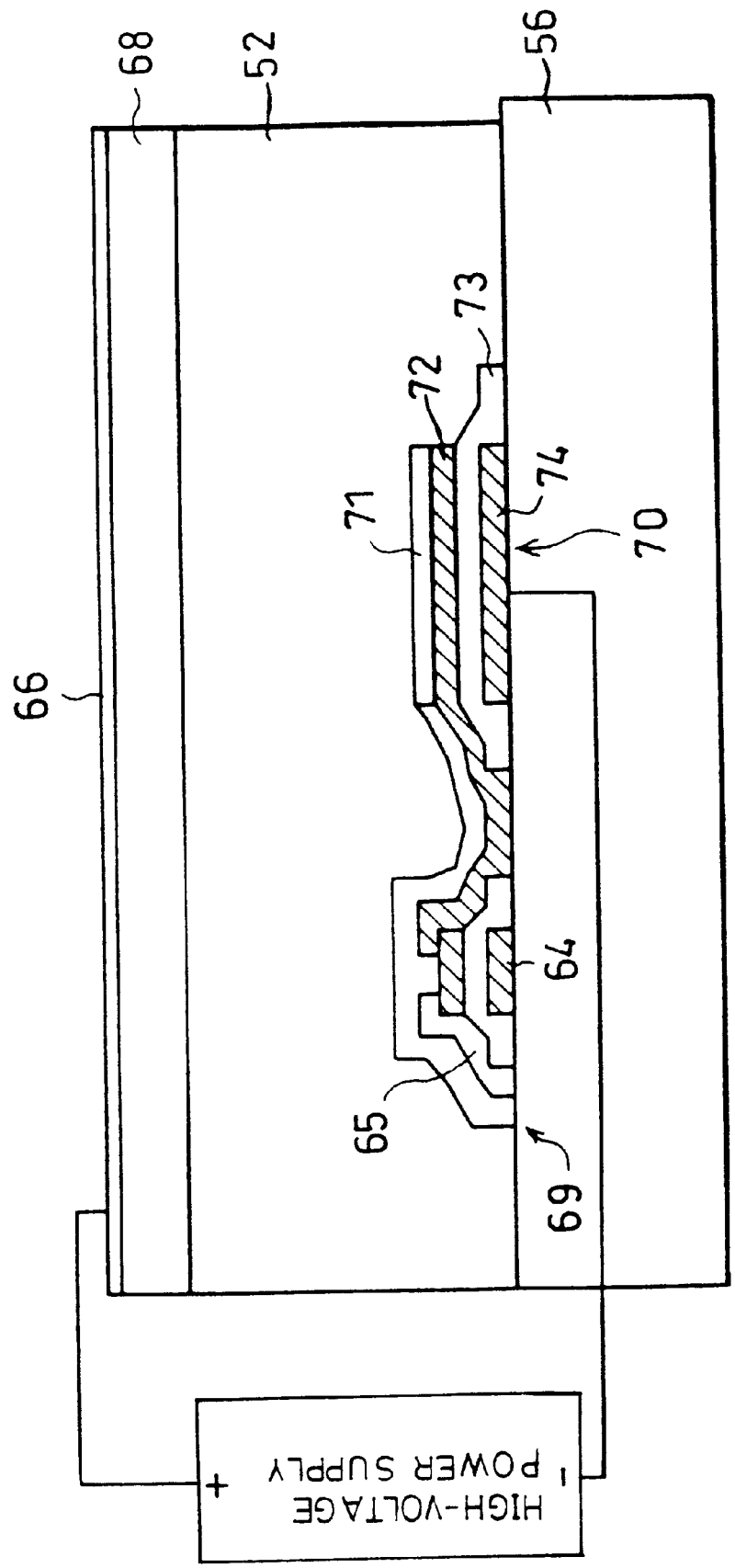
FIG. 12 is a circuit diagram showing an equivalent circuit for one pixel of the conventional two-dimensional image detector.
Figure 13:
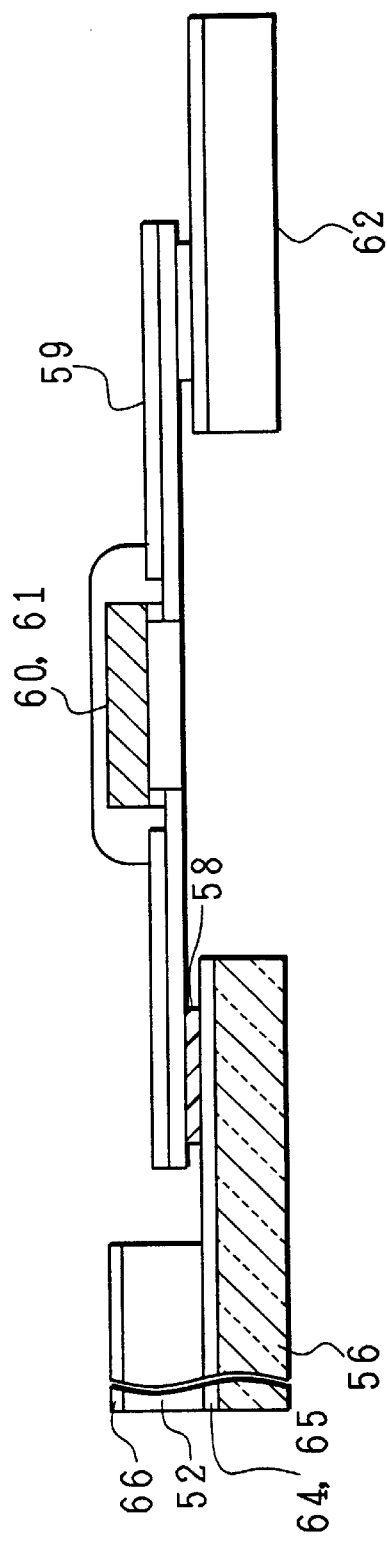
FIG. 13($a$) is a sectional drawing showing an example of packaging external circuits on the conventional two-dimensional image detector in accordance with conventional TCP method.
Figure 13:
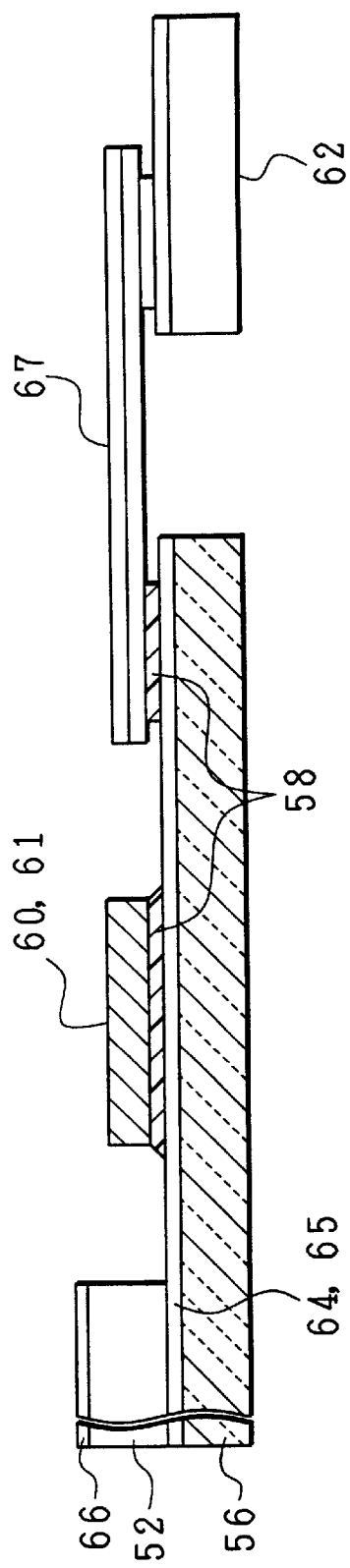

Furthermore, in order to cool the stage 2, it is possible to adopt, for example, the construction of Embodiments 1 to 3, in which the cooling gases are discharged by the cooling medium discharging nozzle 3, or the construction for cooling the area of the stage 2a, that corresponds to the area having the a-Se film 12, from the back of the stage 2a by using a cooling fan and others. Moreover, the construction can be adopted, in which the cooling head 17 of Embodiment 4 is brought into contact with the stage 2. In this case, as shown in FIG. 10, it is also possible to adopt the construction in which a concave 2f is formed on the back (base) of the stage 2, and the top (end 17a) of the cooling head 17 enters the space 2d formed by the concave 2f, and then, the end 17a of the cooling head 17 is brought into contact with the stage 2 to cool the stage 2.

According to this arrangement, the cooling operation by the cooling head 17 is performed on the stage 2, so that the stage 2 itself acts as a cushioning material for absorbing an impact applied from the cooling head 17 to the active-matrix substrate 6. In addition, according to this arrangement, the cooling operation by the cooling head 17 is performed on the stage 2, so that it is possible to prevent crystallization of the a-Se film 12, namely, deterioration in characteristics while securing a distance between the thermocompression bonding part 8 and a cooling position of the cooling head 17 so as to prevent interruption of heating on the thermocompression bonding part 8. Further, the cooling operation by the cooling head 17 is performed on the stage 2 so as to widen the range of choices in the size of the cooling head 17; thus, the cooling head 17 can prevent crystallization of the a-Se film 12, namely, deterioration in characteristics, regardless of a distance between the a-Se film 12 and the input/output terminals 7 on the active-matrix substrate 6.

When the active-matrix substrate 6 is cooled from the back, the sizes of the space 2d and the cooling head 17 are adjusted so as to widely cool the active-matrix substrate 6. For example, the cooling operation can be performed a) from the part between the a-Se film 12 and the thermocompression bonding part 8 disposed between the external circuits and the input/output terminals 7 on the active-matrix substrate 6 b) to the part of the a-Se film 12 in the vicinity of the input/output terminals 7, or c) to the center of the a-Se film 12. Additionally, with the cooling head 17, unlike the construction in which the cooling medium 4 is discharged in a gas state onto the active-matrix substrate 6, the cooling medium 4 is not dispersed and the heating head 5 is not cooled by the cooling medium 4. Thus, the heating of the anisotropic conductive adhesive is not interrupted on the thermocompression bonding part 8. Consequently, it is possible to efficiently suppress crystallization of the a-Se film 12, namely, deterioration in characteristics while minimizing the cooling of the thermocompression bonding part 8.

Furthermore, in addition to the cooling head 17, such a space 2d can be effectively used in a case where the back of the active-matrix substrate 6 is cooled by the cooling medium discharging nozzle 3. In this case, the concave 2f (space 2d) can suppress the dispersion of the cooling medium 4 so as to perform the more partial cooling operation on the concave 2f (space 2d).

As mentioned above, a cooling and/or heat-dissipating operation is performed on the a-Se film 12 via the stage 2 so as to perform a cooling and/or heat-dissipating operation on a desired area except for the thermocompression bonding part 8, while minimizing the cooling and/or heat-dissipating effect by the cooling/heat-dissipating mechanism on the thermocompression bonding part 8 of the two-dimensional image detector. This arrangement makes it possible to prevent crystallization of the amorphous semiconductor layer, namely, deterioration in characteristics during the efficient thermocompression bonding.

Moreover, the above description discusses the construction in which a temperature of the a-Se film 12 is maintained below its crystallizing temperature by the cooling effect, or the cooling and heat-dissipating effect of the stage 2. The external circuit packaging method of the present invention is not particularly limited.

Namely, in addition to the method in which the space (space 2d) is formed in the stage 2, a temperature of the a-Se film 12 can be maintained below its crystallizing temperature by the heat-dissipating mechanism of the stage 2, without cooling the active-matrix substrate 6 by the cooling mechanism disposed on the stage 2.

For example, it is possible to adopt the method in which resin and metal with a small thermal capacity and high heat-dissipating effect is used as the material A. According to this method, heat is not accumulated in the active-matrix substrate 6 but is conducted and dissipated into the stage 2a so as to maintain a temperature of the active-matrix substrate 6 below the crystallizing temperature of the a-Se film 12, namely, the amorphous semiconductor layer.

In this case, the above effect can be improved by forming the stage 2a with a thin film belt and others, or by providing the heat-dissipating section with a hole on the stage 2a.

Furthermore, as described above, the space 2d is provided between the stage 2a and the stage 2b in the above arrangement so as to improve the above-mentioned effect.

Additionally, the cooling methods of Embodiments 1 to 3, the cooling method of Embodiment 4, and the cooling method of Embodiment 5 can be used alone or in combination with one another.

Further, Embodiments 1 to 5 mainly discuss the two-dimensional image detector for an X-ray (radiation); however, the two-dimensional image detector using the external circuit packaging method of the present invention is not particularly limited. When a used semiconductor (electromagnetic wave conductor) shows electromagnetic wave conduction to a visible ray and an infrared ray as well as to radiation such as an X-ray, the present invention is also applicable to the two-dimensional image detector for a visible ray and an infrared ray.

For example, a-Se has favorable electromagnetic conduction to a visible ray, and a high-sensitivity image sensor has been developed by using an avalanche effect obtained by applying a high electric field, so that the present invention is also applicable to such a two-dimensional image detector for visible ray image.

Further, the above-mentioned crystallization (deterioration in characteristics) of the a-Se film, that is caused by heating, is not particularly limited to the a-Se film but is a common phenomenon among all the amorphous materials although crystallizing temperatures are different from one another. Consequently, the present invention can be widely adopted in a case where a film made of amorphous materials such as a-Si, a-SiC, and a-SiGe other than a-Se is used as an electromagnetic wave conducting film.

As described above, an external circuit packaging method of the present invention, in which external circuits (for example, a driving circuit, a reading circuit, TCP substrates including these circuits, or FPC circuits used for connecting circuit substrates (PWB)) are packaged (for example, TCP connection by TCP method, COG connection by COG method, and FPC connection) by thermocompression bonding onto input/output terminals of a substrate including an amorphous semiconductor layer (for example, an active-matrix substrate in a two-dimensional image detector), is characterized by maintaining a temperature of the amorphous semiconductor layer below its crystallizing temperature during a thermocompression bonding.

According to this method, even when the external circuits are packaged onto the input/output terminals of the substrate by a conventional thermocompression bonding method such as TCP method and COG method, it is possible to prevent deterioration in characteristics such as high dark resistance. The deterioration is caused by crystallization of the amorphous semiconductor layer. Therefore, according to this method, it is possible to prevent exfoliation caused by a change in volume according to phase change of the amorphous semiconductor layer and to prevent deterioration in characteristics such as high dark resistance of the amorphous semiconductor layer. Further, in this method, the external circuits are packaged onto the substrate including the amorphous semiconductor layer, so that it is possible to avoid a variety of problems caused by forming the amorphous semiconductor layer after packaging the external circuits, to prevent exfoliation of the amorphous semiconductor layer during a re-packaging operation, which is performed in the event of a defect on an external circuit such as a driving IC and a reading IC, and to prevent deterioration in characteristics of the amorphous semiconductor layer. This method therefore makes it possible to provide an external circuit packaging method which does not cause exfoliation of the semiconductor layer and deterioration in characteristics of the amorphous semiconductor layer both in the packaging and re-packaging, in the case of the external circuits packaged by thermocompression bonding onto the input/output terminals of the substrate including the amorphous semiconductor layer.

In the present invention, when a temperature of the amorphous semiconductor layer is maintained below its crystallizing temperature, the following method is used: to be specific, a cooling operation is performed on at least a) a part between the amorphous semiconductor layer and a thermocompression bonding part disposed between the external circuits and the input/output terminals on the substrate and/or b) a part of the amorphous semiconductor layer in the vicinity of the input/output terminals, so that a temperature of the amorphous semiconductor layer is maintained below its crystallizing temperature.

At least a cooling operation is performed on the part between the amorphous semiconductor layer and the thermocompression bonding part disposed between the external circuits and the input/output terminals on the substrate, so that a cooling operation is performed at least from the thermocompression bonding part to the amorphous semiconductor layer, thereby removing most of heat before the heat is conducted from the thermocompression bonding part to the amorphous semiconductor layer. It is therefore possible to more efficiently suppress the heat conduction from the thermocompression bonding part to the amorphous semiconductor layer. Consequently, it is possible to efficiently suppress an increase in temperature of the amorphous semiconductor layer so as to maintain a temperature of the amorphous semiconductor layer below its crystallizing temperature during a thermocompression bonding.

Moreover, the cooling operation is performed on at least a part of the amorphous semiconductor layer in the vicinity of the input/output terminals so as to cool at least a starting point of the heat conduction from the thermocompression bonding part to the amorphous semiconductor layer, thereby suppressing an increase in temperature of the amorphous semiconductor layer that is caused by heat conducted from the thermocompression bonding part. It is therefore possible to maintain a temperature of the amorphous semiconductor layer below its crystallizing temperature during a thermocompression bonding. The method for cooling the part of the amorphous semiconductor layer in the vicinity of the input/output terminals is particularly effective in the case of a short distance between the amorphous semiconductor layer and the input/output terminals on the substrate. In this case as well, it is possible to suppress the cooling of the thermocompression bonding part so as to efficiently perform a thermocompression bonding, and to suppress an increase in temperature of the amorphous semiconductor layer so as to maintain a temperature of the amorphous semiconductor layer below its crystallizing temperature.

For this reason, the present invention makes it possible to provide an external circuit packaging method which does not cause exfoliation of the amorphous semiconductor layer and deterioration in characteristics of the amorphous semiconductor layer in a case where the external circuits are packaged by thermocompression bonding onto the input/output terminals on the substrate including the amorphous semiconductor layer.

On the above substrate, a) the part between the amorphous semiconductor layer and the thermocompression bonding part disposed between the external circuits and the input/output terminals on the substrate and/or b) the part of the amorphous semiconductor layer in the vicinity of the input/output terminals are cooled by supplying a cooling medium to at least one of the substrate surfaces, that has the amorphous semiconductor layer thereon, and the other surface.

The cooling operation is performed by supplying the cooling medium to at least one of the substrate surfaces, that has the amorphous semiconductor layer thereon, and the other surface; thus, it is possible to efficiently and readily cool the part between the amorphous semiconductor layer and the thermocompression bonding part disposed between the external circuits and the input/output terminals on the substrate, or the part of the amorphous semiconductor layer in the vicinity of the input/output terminals. A cooling medium supplying means such as a discharging nozzle can be used for supplying the cooling medium. Such a cooling medium supplying means can be readily set at a desired position for supplying the cooling medium. Therefore, it is possible to reduce restrictions such as the placement of the members used for packaging the external circuits so as to cool a desired position with ease. As the cooling medium, it is possible to adopt a variety of cooling agents such as nitrogen and a CFC substitute agent. Particularly, the cooling operation can be efficiently carried out by directly supplying these cooling mediums to one of the substrate surfaces, that has the amorphous semiconductor layer thereon, and the other surface.

In this case, the cooling medium is supplied diagonally from the side of the input/output terminals. Thus, the cooling medium is supplied with directivity from the side of the input/output terminals to the amorphous semiconductor layer, so that most of the supplied cooling medium is discharged away from the thermocompression bonding part. Thus, when the cooling medium is diagonally supplied from the side of the input/output terminals, the cooling on the thermocompression bonding part is prevented so as to efficiently perform a thermocompression bonding and to efficiently suppress an increase in temperature of the amorphous semiconductor layer, thereby preventing crystallization of the amorphous semiconductor layer.

Furthermore, the cooling operation can be performed on a) the part between the amorphous semiconductor layer and the thermocompression bonding part disposed between the external circuits and the input/output terminals on the substrate and/or b) the part of the amorphous semiconductor layer in the vicinity of the input/output terminals, by bringing a cooling member into contact with at least one of the substrate surfaces, that has the amorphous semiconductor layer thereon, and the other surface. The cooling member cools a contact portion by making contact.

The cooling operation is performed by bringing the cooling member into contact with at least one of the substrate surfaces, that has the amorphous semiconductor layer thereon, and the other surface. Thus, it is possible to readily and efficiently cool the part between the amorphous semiconductor layer and the thermocompression bonding part disposed between the external circuits and the input/output terminals on the substrate, or the part of the amorphous semiconductor layer in the vicinity of the input/output terminals.

Additionally, this method makes it possible to accurately and readily set a contact position of the cooling member, namely, a desired position to be cooled on the substrate, unlike a cooling medium such as gas which is dispersed on the substrate. Furthermore, according to this method, the heating on the thermocompression bonding part is not interrupted by the dispersed cooling medium. Therefore, this method makes it possible to minimize the cooling on the thermocompression bonding part and to prevent crystallization of the amorphous semiconductor layer, namely, deterioration in characteristics, particularly in the case of a short distance between the input/output terminals and the amorphous semiconductor layer on the substrate.

Further, in the present invention, in addition to the aforementioned methods, the following method is also applicable for maintaining a temperature of the amorphous semiconductor layer below its crystallizing temperature during a thermocompression bonding: a cooling and/or heat-dissipating operation is performed on an area of a substrate placement part, on which the substrate is disposed during the thermocompression bonding, the area corresponding at least a) the part between the amorphous semiconductor layer and the thermocompression bonding part disposed between the external circuits and the input/output terminals on the substrate and/or b) the part of the amorphous semiconductor layer in the vicinity of the input/output terminals.

According to this method, it is possible to suppress an increase in temperature of the amorphous semiconductor layer formed on the substrate, because of the cooling and heat-dissipating effect of the substrate placement part, only by disposing the substrate subjected to a thermocompression bonding such that the substrate surface and the surface of the substrate placement part are in parallel with each other. Hence, it is possible to readily and efficiently maintain a temperature of the amorphous semiconductor layer below its crystallizing temperature.

For instance, the substrate placement part can be cooled by using a cooling medium.

According to this method, the cooling medium is used for cooing the substrate placement part so as to efficiently and readily perform the cooling operation. With this method, the cooling operation by the cooling medium is performed on the substrate placement part; thus, this method has an advantage of widening the range of choices in the cooling medium. When the substrate placement part is cooled, it is possible to adopt, for example, a method for supplying the cooling medium to the substrate placement part by using the cooling medium supplying means such as a discharging nozzle, and a cooling medium transporting (ventilation) mechanism composed of a path (duct), a through hole, and the like disposed in the substrate placement part and on a surface of the substrate placement part. In this case, the substrate placement part is cooled by using a cooling medium circulating mechanism, in which the cooling medium is circulated by the path (duct), the through hole, and others disposed in the substrate placement part or on the surface of the substrate placement part; thus, it is possible to efficiently carry out the cooling operation with a simple construction at low cost without the necessity for collecting the supplied cooling medium or using the cooling medium more than necessary.

Furthermore, the substrate placement part can be cooled by bringing the cooling member into contact with the substrate placement part. The cooling member cools a contact part by making contact.

According to this method, the cooling medium for cooling a contact part by making contact is used so as to simply and efficiently perform the cooling operation. The cooling operation is performed on the substrate placement part by the cooling member in this method, so that the substrate placement part itself acts as a cushioning material for absorbing an impact applied from the cooling member to the substrate. Additionally, according to this method, the cooling operation is performed on the substrate placement part by the cooling member, so that crystallization of the amorphous semiconductor layer, namely, deterioration in characteristics can be prevented, while securing a distance between the thermocompression bonding part and a cooling position of the cooling member so as to suppress interruption of heat on the thermocompression bonding part. Further, the cooling operation is performed on the substrate placement part by the cooling member so as to widen the range of choices in the size of the cooling member. Hence, regardless of a distance between the input/output terminals and the amorphous semiconductor layer on the substrate, the cooling member is capable of preventing crystallization of the amorphous semiconductor layer, namely, deterioration in characteristics.

The present invention is effective particularly in a case where the amorphous semiconductor layer is mainly composed of selenium.

The amorphous selenium (a-Se) has high dark resistance. For example, when the external circuits are packaged onto the two-dimensional image detector as the substrate, it is possible to obtain an image signal with excellent sensitivity (S/N ratio) to an X-ray. However, the amorphous selenium has very low heat resistance as compared with other amorphous materials. Crystallization is developed and the characteristics are degraded at 70° C. or more. For this reason, the external circuit packaging method of the present invention can be effectively adopted in a case where the external circuits are packaged on the substrate provided with the amorphous semiconductor layer, which is mainly composed of selenium (amorphous selenium).

Moreover, as described above, a thermocompression bonding apparatus of the present invention, in which external circuits (for example, a driving circuit, a reading circuit, TCP substrates including these circuits, or FPC circuits used for connecting circuit substrates (PWB)) are packaged (for example, TCP connection by TCP method, COG connection by COG method, and FPC connection) by thermocompression bonding onto input/output terminals of a substrate including an amorphous semiconductor layer, said apparatus including a thermocompression bonding means (for example, a heating tool such as a heating head; thermocompression bonding member), characterized by including a cooling/heat-dissipating mechanism (for example, a cooling medium supplying means such as a discharging nozzle; a cooling medium transporting (ventilation) mechanism or a cooling medium circulating mechanism composed of a path (duct), a through hole, and others in the substrate placement part and on a surface of the substrate placement part, which is included in the thermocompression bonding apparatus; a cooling member contact mechanism provided with a cooling member such as a cooling head; a substrate placement part composed of a plurality of materials that differ in heat conduction; a substrate placement part, in which a space is provided on at least a) a part between the amorphous semiconductor layer and the thermocompression bonding part disposed between the external circuits and the input/output terminals on the substrate and/or b) a part of the amorphous semiconductor layer in the vicinity of the input/output terminals on the substrate) for performing a cooling and/or heat-dissipating operation on a) the part between the amorphous semiconductor layer and the thermocompression bonding part disposed between the external circuits and the input/output terminals on the substrate and/or b) the part of the amorphous semiconductor layer in the vicinity of the input/output terminals on the substrate, during a thermocompression bonding.

According to this arrangement, during a thermocompression bonding, the cooling/heat-dissipating mechanism performs the cooling and/or heat-dissipating operation on at least a) the part between the amorphous semiconductor layer and the thermocompression bonding part disposed between the external circuits and the input/output terminals on the substrate and/or b) the part of the amorphous semiconductor layer in the vicinity of the input/output terminals on the substrate; hence, it is possible to suppress an increase in temperature of the amorphous semiconductor layer that is caused by heat conducted from the thermocompression bonding part. Thus, during the thermocompression bonding, a temperature of the amorphous semiconductor layer can be maintained below its crystallizing temperature. Consequently, this arrangement makes it possible to provide a thermocompression bonding apparatus, in which the external circuits are packaged by thermocompression bonding without causing exfoliation and deterioration in characteristics of the amorphous semiconductor layer in a case where the external circuits are packaged by thermocompression bonding onto the input/output terminals of the substrate including the amorphous semiconductor layer, namely, it is possible to provide a thermocompression bonding apparatus used for the external circuit packaging method of the present invention.

The cooling/heat-dissipating mechanism is preferably provided with the cooling medium supplying means, which supplies cooling medium to at least one of the substrate surface having the amorphous semiconductor layer thereon and the other surface.

According to this arrangement, the substrate is cooled by supplying cooling medium to at least one of the substrate surface having the amorphous semiconductor layer thereon and the other surface, so that the cooling operation can be carried out in a simple and efficient manner. A discharging nozzle and the like can be adopted as the cooling medium supplying means. Such a cooling medium supplying means can be readily set at a desired position for supplying cooling medium. Therefore, according to this arrangement, the restrictions of the members used for packaging the external circuits can be reduced so as to cool a desired place with ease. It is possible to adopt a variety of cooling agents including a nitrogen and CFC substitute agent. Particularly, the cooling medium supplying means is arranged so as to directly supply these cooling mediums to at least one of the substrate surface having the amorphous semiconductor layer thereon and the other surface; thus, the substrate can be efficiently cooled.

The cooling medium supplying means is preferably arranged such that the cooling medium is diagonally supplied from the side of the input/output terminals.

According to this arrangement, the cooling medium is supplied from the side of the input/output terminals to the amorphous semiconductor layer with directivity, so that most of the supplied cooling medium is discharged away from the thermocompression bonding part. Therefore, according to this arrangement, it is possible to prevent the thermocompression bonding part from being cooled so as to efficiently perform a thermocompression bonding, and it is possible to efficiently suppress an increase in temperature of the amorphous semiconductor layer so as to prevent crystallization thereof.

Further, the thermocompression bonding apparatus of the present invention can be also arranged such that the cooling/heat-dissipating mechanism is provided with a cooling member for cooling a contact part by making contact on at least one of the substrate surface having the amorphous semiconductor layer thereon and the other surface.

According to this arrangement, the cooling member is brought into contact with at least one of the substrate surfaces having the amorphous semiconductor layer thereon and the other surface so as to cool the substrate; thus, the cooling operation can be performed in a simple and efficient manner.

As the cooling/heat-dissipating mechanism provided with the cooling member, it is possible to adopt, for example, a cooling member contact mechanism constituted by a cooling head composed of a metallic block, and a cooling head ascending/descending mechanism composed of an air cylinder. The cooling head itself is composed of a metallic block, which is made of a material such as copper with excellent heat conduction, and one of the ends is subjected to a cooling/heat-dissipating operation by cooling medium such as water, a heat-dissipating plate, and a fan. Thus, heat generated on the substrate can be efficiently absorbed.

It is easy to accurately set such a cooling member (cooling member contact mechanism) at a desired cooling position on the substrate, as compared with the construction in which the substrate is cooled by cooling medium such as gas. When the substrate is cooled by cooling medium such as gas, the cooling medium supplied to the substrate is likely to disperse on the substrate; thus, it is difficult to precisely cool a small area; meanwhile, in the case of the cooling member such as the cooling head composed of a metallic block and the like, only the contact part of the cooling medium can be precisely cooled.

Moreover, the thermocompression bonding apparatus of the present invention can be also arranged such that the substrate placement part is further provided for maintaining a temperature of the amorphous semiconductor layer below its crystallizing temperature during a thermocompression bonding, and the cooling/heat-dissipating mechanism performs a cooling and/or heat-dissipating operation on the substrate placement part so as to cool or dissipate heat on at least a) the part between the amorphous semiconductor layer and the thermocompression bonding part disposed between the input/output terminals and the external circuits and/or b) the part of the amorphous semiconductor layer in the vicinity of the input/output terminals.

According to this arrangement, the cooling and/or heat-dissipating operation on the substrate placement part can suppress an increase in temperature of the amorphous semiconductor layer formed on the substrate, only by placing the substrate, which undergoes a thermocompression bonding, such that the substrate surface and the surface of the substrate placement part are in parallel with each other. Hence, a temperature of the amorphous semiconductor layer can be readily and efficiently maintained below its crystallizing temperature.

With this arrangement, the cooling/heat-dissipating mechanism is capable of simply and efficiently cool at least a) the part between the amorphous semiconductor layer and the thermocompression bonding part disposed between the input/output terminals and the external circuits and/or b) the part of the amorphous semiconductor layer in the vicinity of the input/output terminals, for example, by cooling the substrate placement part by the cooling medium. According to this arrangement, the cooling operation is performed on the substrate placement part by the cooling medium so as to widen the range of choices in cooling medium as compared with the construction for directly cooling the substrate. For cooling the substrate placement part, it is possible to adopt, for example, the method for supplying cooling medium to the substrate placement part by using the cooling medium supplying means such as a discharging nozzle; and the cooling medium transporting (ventilation) mechanism including a path (duct), a through hole, and others that are provided in or on the substrate placement part. In this case, the substrate placement part is cooled by using a cooling medium circulating mechanism, in which the cooling medium is circulated by the path (duct), the through hole, and others disposed in the substrate placement part or on the surface of the substrate placement part; thus, it is possible to efficiently carry out the cooling operation with a simple construction at low cost without the necessity for collecting the supplied cooling medium or using the cooling medium more than necessary.

Furthermore, the cooling/heat-dissipating mechanism is provided with the cooling member for cooling a contact part by making contact, and the cooling member is brought into contact with the substrate placement part so as to simply and efficiently cool at least a) the part between the amorphous semiconductor layer and the thermocompression bonding part disposed between the input/output terminals and the external circuits and/or b) the part of the amorphous semiconductor layer in the vicinity of the input/output terminals.

According to this arrangement, the cooling/heat-dissipating mechanism cools the substrate placement part by using the cooling member, which cools a contact part by making contact, so that the cooling operation can be simply and efficiently carried out. The cooling operation by the cooling member is performed on the substrate placement part in this arrangement, so that the substrate placement part itself acts as a cushioning material for absorbing an impact applied from the cooling member to the substrate. Additionally, according to this arrangement, the cooling operation is performed by the cooling member on the substrate placement part, so that crystallization of the amorphous semiconductor layer, namely, deterioration in characteristics can be prevented, while securing a distance between the thermocompression bonding part and a cooling position of the cooling member so as to suppress interruption of heat on the thermocompression bonding part. Further, the cooling operation is performed by the cooling member on the substrate placement part so as to widen the range of choices in the size of the cooling member. Hence, regardless of a distance between the input/output terminals and the amorphous semiconductor layer on the substrate, the cooling member is capable of preventing crystallization of the amorphous semiconductor layer, namely, deterioration in characteristics thereof.

In the present invention, the thermocompression bonding part is preferably arranged such that an area of the substrate placing part, that has the input/output terminals of the substrate thereon, and the other area are made of materials which differ in heat conduction.

According to this arrangement, the heat conduction can be varied between the area of the substrate placement part, that has the input/output terminals of the substrate, and the other area, so that the conduction of heat can be suppressed. Hence, the area of the substrate placement part, that has the input/output terminals thereon, is made of a material (substance) smaller in heat conduction than the other area; thus, even when the area which does not have the input/output terminals is subjected to a cooling or heat-dissipating operation, it is possible to prevent the cooling or heat-dissipating effect from expanding to the area having the input/output terminals. For this reason, this arrangement makes it possible to cool or dissipate heat on a desired area while minimizing the cooling or heat-dissipating effect on the thermocompression bonding part, so that the thermocompression bonding can be efficiently carried out. The effect is outstanding especially in a case where the area having the input/output terminals of the substrate is made of a material (substance) such as a heat insulator and the like with relatively low heat conduction and the other area is made of a material (substance) with excellent heat conduction. Further, in this case, it is further possible to prevent thermocompression bonding heat of the input/output terminals from being conducted to the area other than the input/output terminals, particularly, the area of the substrate that has the amorphous semiconductor layer thereon.

Moreover, the thermocompression bonding apparatus is preferably arranged such that the substrate placement part includes a space at least on an area corresponding to the part between the amorphous semiconductor layer and the thermocompression bonding part disposed between the external circuits and the input/output terminals on the substrate, or the part of the amorphous semiconductor layer in the vicinity of the input/output terminals on the substrate.

According to this arrangement, with the space, it is possible to efficiently dissipate heat and to suppress conduction of heat from the thermocompression bonding part to the amorphous semiconductor layer on the substrate. On an area corresponding to at least the part between the amorphous semiconductor layer and the thermocompression bonding part disposed between the external circuits and the input/output terminals on the substrate, or the part of the amorphous semiconductor layer in vicinity of the input/output terminals; or an area corresponding to the above parts and a part of the substrate having the amorphous semiconductor layer, the space can be readily formed by (1) providing a concave or groove; (2) dividing the substrate placement part into two members and disposing the members constituting the substrate placement part with an interval on the above areas (namely, the substrate placement part is divided on the areas); or hollowing the areas to form a through hole so as to partially make an opening in the substrate placement part.

The space achieves effective cooling and/or heat dissipating on the part between the amorphous semiconductor layer and the thermocompression bonding part disposed between the external circuits and the input/output terminals on the substrate, or the part of the amorphous semiconductor layer in the vicinity of the input/output terminals on the substrate.

Additionally, such a space can be effectively used for cooling the back of the substrate by using the cooling member such as the cooling head or the cooling medium supplying means such as a discharging nozzle so as to more partially cool the substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An external circuit packaging method, in which an external circuit is packaged by thermocompression bonding onto an input/output terminal of a substrate on which an amorphous semiconductor layer is formed, said amorphous semiconductor layer maintaining a temperature below a crystallizing temperature thereof during the thermocompression bonding by locally cooling and/or locally liberating heat from a portion of the substrate other than a thermocompression part of the substrate where the input/output terminal is provided, without directly cooling the thermocompression part, while heating the thermocompression part of the substrate by thermocompression.

2. The external circuit packaging method as defined in claim 1, wherein a cooling operation is performed on at least a part between said amorphous semiconductor layer and a thermocompression bonding part disposed between said external circuit and said input/output terminal on said substrate and/or a part of said amorphous semiconductor layer in the vicinity of said input/output terminal, in order to maintain the temperature of said amorphous semiconductor layer below a crystallizing temperature thereof.

3. The external circuit packaging method as defined in claim 2, wherein sufficient heat is removed to prevent adverse effects before the heat is conducted from the thermocompression bonding to the amorphous semiconductor layer.

4. The external circuit packaging method as defined in claim 2, wherein said cooling operation is performed by supplying a cooling medium to at least one of a substrate surface having said amorphous semiconductor layer thereon and a back surface.

5. The external circuit packaging method as defined in claim 4, wherein sufficient heat is removed to prevent adverse effects before the heat is conducted from the thermocompression bonding to the amorphous semiconductor layer.

6. The external circuit packaging method as defined in claim 4, wherein said cooling medium is supplied by a cooling water circulating mechanism disposed on a substrate placement part.

7. The external circuit packaging method as defined in claim 6, wherein sufficient heat is removed to prevent adverse effects before the heat is conducted from the thermocompression bonding to the amorphous semiconductor layer.

8. The external circuit packaging method as defined in claim 2, wherein said cooling operation is performed by bringing a cooling member into contact with at least one of a substrate surface having said amorphous semiconductor layer thereon and a back surface, said cooling member cooling a contact place by making contact.

9. The external circuit packaging method as defined in claim 8, wherein sufficient heat is removed to prevent adverse effects before the heat is conducted from the thermocompression bonding to the amorphous semiconductor layer.

10. The external circuit packaging method as defined in claim 1, wherein a cooling and/or heat-dissipating operation is performed on an area of a substrate placement part, that corresponds to at least a part between said amorphous semiconductor layer and said thermocompression bonding part disposed between said external circuit and said input/output terminal on the substrate and/or a part of said amorphous semiconductor layer in the vicinity of said input/output terminal, in order to maintain the temperature of said amorphous semiconductor layer below a crystallizing temperature thereof, said substrate placement part being provided with said substrate thereon during the thermocompression bonding.

11. The external circuit packaging method as defined in claim 10, wherein said substrate placement part is cooled by using a cooling medium.

12. The external circuit packaging method as defined in claim 10, wherein said substrate placement part is cooled by bringing a cooling member into contact with said substrate placement part, said cooling member cooling a contact place by making contact.

13. The external circuit packaging method as defined in claim 12, wherein sufficient heat is removed to prevent adverse effects before the heat is conducted from the thermocompression bonding to the amorphous semiconductor layer.

14. The external circuit packaging method as defined in claim 10, wherein sufficient heat is removed to prevent adverse effects before the heat is conducted from the thermocompression bonding to the amorphous semiconductor layer.

15. The external circuit packaging method as defined in claim 1, wherein said amorphous semiconductor layer is mainly composed of selenium.

16. The external circuit packaging method as defined in claim 1, wherein said substrate is an electrode substrate of a two-dimensional image detector, which includes said amorphous semiconductor layer with electromagnetic wave conduction, and an image detecting section for detecting an electromagnetic wave image emitted to said amorphous semiconductor layer in response to a control signal inputted from said input/output terminal of said substrate and for outputting an image signal in accordance with the electromagnetic wave image.

17. The external circuit packaging method as defined in claim 16, wherein sufficient heat is removed to prevent adverse effects before the heat is conducted from the thermocompression bonding to the amorphous semiconductor layer.

18. The external circuit packaging method as defined in claim 1, wherein said substrate is an active-matrix substrate.

19. An external circuit packaging method, in which an external circuit is packaged by thermocompression bonding onto an input/output terminal of a substrate on which an amorphous semiconductor layer is formed, said amorphous semiconductor layer maintaining a temperature below a crystallizing temperature thereof during the thermocompression bonding, wherein a cooling operation is performed on at least a part between said amorphous semiconductor layer and a thermocompression bonding part disposed between said external circuit and said input/output terminal on said substrate and/or a part of said amorphous semiconductor layer in the vicinity of said input/output terminal, in order to maintain the temperature of said amorphous semiconductor layer below a crystallizing temperature thereof, wherein said cooling operation is performed by supplying a cooling medium to at least one of a substrate surface having said amorphous semiconductor layer thereon and a back surface, and wherein said cooling medium is supplied diagonally from a side of said input/output terminal.

20. The external circuit packaging method as defined in claim 19, wherein sufficient heat is removed to prevent adverse effects before the heat is conducted from the thermocompression bonding to the amorphous semiconductor layer.

* * * * *